United States Patent
Li et al.

(10) Patent No.: US 11,366,462 B2
(45) Date of Patent: Jun. 21, 2022

(54) HIGH-VOLTAGE INTERLOCK DEVICE AND FAULT DETECTION METHOD THEREOF

(71) Applicant: Contemporary Amperex Technology Co., Limited, Ningde (CN)

(72) Inventors: Weiqiang Li, Ningde (CN); Yanhui Fu, Ningde (CN); Changjian Liu, Ningde (CN)

(73) Assignee: Contemporary Amperex Technology Co., Limited, Ningde (CN)

(*) Notice: Subject to any disclaimer, the term of this patent is extended or adjusted under 35 U.S.C. 154(b) by 0 days.

(21) Appl. No.: 17/486,993

(22) Filed: Sep. 28, 2021

(65) Prior Publication Data

US 2022/0011762 A1    Jan. 13, 2022

Related U.S. Application Data

(63) Continuation of application No. PCT/CN2021/081137, filed on Mar. 16, 2021.

(30) Foreign Application Priority Data

Jun. 12, 2020 (CN) .......................... 202010536684.2

(51) Int. Cl.
G05B 23/02 (2006.01)
H04Q 11/00 (2006.01)
(Continued)

(52) U.S. Cl.
CPC ..... *G05B 23/0256* (2013.01); *G01R 31/3274* (2013.01); *G01R 31/3275* (2013.01);
(Continued)

(58) Field of Classification Search
None
See application file for complete search history.

(56) References Cited

U.S. PATENT DOCUMENTS

2014/0062180 A1* 3/2014 Demmerle ................ B60L 3/00
  307/9.1
2019/0184835 A1* 6/2019 Karlsson ................. B60L 3/04

FOREIGN PATENT DOCUMENTS

CN    105313700 A    2/2016
CN    104203635 B    9/2016
(Continued)

OTHER PUBLICATIONS

PCT International Search Report for PCT/CN2021/081137, dated Jun. 21, 2021, 14 pages.
(Continued)

*Primary Examiner* — Nasima Monsur
(74) *Attorney, Agent, or Firm* — Law Offices of Liaoteng Wang

(57) ABSTRACT

The application provide a high-voltage interlock device and a fault detection method thereof. The high-voltage interlock device includes: a first signal detection circuit, configured to collect a first original electric signal from a high-voltage interlock component and convert the first original electric signal into a first sampled signal while ensuring that the high-voltage interlock component is isolated from a fault diagnosis module; a second signal detection circuit, configured to collect a second original electric signal from the high-voltage interlock component and convert the second original electric signal into a second sampled signal while ensuring that the high-voltage interlock component is isolated from the fault diagnosis module; the fault diagnosis module, configured to determine a fault of the high-voltage interlock component according to the first and/or the second sampled signal, under a condition that at least one of the first and the second switch modules is in an OFF state.

19 Claims, 6 Drawing Sheets

(51) Int. Cl.
    *G01R 31/327*     (2006.01)
    *H02H 3/05*     (2006.01)

(52) U.S. Cl.
    CPC ........... *H02H 3/05* (2013.01); *H04Q 11/0005* (2013.01); *H04Q 2011/0039* (2013.01); *H04Q 2213/08* (2013.01)

(56) References Cited

FOREIGN PATENT DOCUMENTS

| | | |
|---|---|---|
| CN | 109017317 A | 12/2018 |
| CN | 109100597 A | 12/2018 |
| CN | 109541494 A | 3/2019 |
| CN | 110261712 A | 9/2019 |
| CN | 209938334 U | 1/2020 |
| CN | 110967616 A | 4/2020 |
| KR | 101567261 B1 | 11/2015 |

OTHER PUBLICATIONS

Haifeng Liu Failure and maintenance of high voltage interlock of new energy vehicles Journal of Liaoning Teachers college (Natural Science Edition) Dec. 31, 2019(Dec. 31, 2019) The fourth issue, vol. 21 ISSN: 1008-5688 pp. 101-104.

The Extended European Search Report for European Application No. 21755345.2, dated May 3, 2022, 10 pages.

\* cited by examiner

HIGH-VOLTAGE INTERLOCK DEVICE AND FAULT DETECTION METHOD THEREOF

CROSS-REFERENCE TO RELATED APPLICATION

This application is a continuation of International Application No. PCT/CN2021/081137, filed on Mar. 16, 2021, which claims priority to Chinese Patent Application No. 202010536684.2, filed on Jun. 12, 2020 and titled "HIGH-VOLTAGE INTERLOCK CIRCUIT AND FAULT DETECTION METHOD THEREOF", both of which are incorporated herein by reference in their entireties.

FIELD

The present application relates to the technical field of batteries, and in particular, to a high-voltage interlock device and a fault detection method thereof.

BACKGROUND

With the rapid development of new energy vehicles, people are paying more and more attentions to the safety of new energy vehicles. The biggest difference between a new energy vehicle and a traditional vehicle is that the new energy vehicle relies on a high voltage and high current to provide power for the vehicle. Therefore, high-voltage safety issues cannot be ignored in the design of new energy vehicles. A high-voltage interlock device is a common high-voltage loop safety monitoring system that is mainly used to monitor on-off states of various high-voltage components of electric vehicles, such as high-voltage components including a high-voltage connector, a Manual Service Disconnect (MSD), or high-voltage power supply equipment. A vehicle controller may determine, according to the detected situation, whether to disconnect a high-voltage circuit, to keep the vehicle in a safe state.

In existing detection schemes, signals collected at both ends of a high-voltage component are directly input to a fault detection device. When a large voltage appears externally, the fault detection device may be directly damaged, and safety of the high-voltage interlock device cannot be guaranteed.

SUMMARY

Embodiments of the present application provide a high-voltage interlock device and a fault detection method thereof.

In an aspect, the embodiments of the present application provide a high-voltage interlock device, including: a first signal detection circuit, a first connection terminal of the first signal detection circuit being connected to an end of a high-voltage interlock component under detection, a second connection terminal of the first signal detection circuit being connected to an end of a first switch module, an output terminal of the first signal detection circuit being connected to a fault diagnosis module, and the first signal detection circuit being configured to collect a first original electric signal from the high-voltage interlock component under detection and convert the first original electric signal into a first sampled signal while ensuring that the high-voltage interlock component under detection is isolated from the fault diagnosis module; a second signal detection circuit, a first connection terminal of the second signal detection circuit being connected to another end of the high-voltage interlock component under detection, a second connection terminal of the second signal detection circuit being connected to an end of a second switch module, an output terminal of the second signal detection circuit being connected to the fault diagnosis module, and the second signal detection circuit being configured to collect a second original electric signal from the high-voltage interlock component under detection and convert the second original electric signal into a second sampled signal while ensuring that the high-voltage interlock component under detection is isolated from the fault diagnosis module; the first switch module, another end of the first switch module being connected to a first power terminal; the second switch module, another end of the second switch module being connected to a second power terminal; the fault diagnosis module, configured to determine a fault of the high-voltage interlock component under detection according to the first sampled signal and/or the second sampled signal, under a condition that at least one of the first switch module and the second switch module is in an OFF state.

In another aspect, the embodiments of the present application provide a fault detection method for the high-voltage interlock device, including: acquiring the first sampled signal and the second sampled signal under a condition that at least one of the first switch module and the second switch module is in the OFF state; determining the fault of the high-voltage interlock component under detection according to the first sampled signal and the second sampled signal.

BRIEF DESCRIPTION OF THE DRAWINGS

In order to illustrate technical solutions of embodiments of the present application more clearly, drawings necessary for the embodiments of the present application will be introduced briefly below. Obviously, the drawings described below are only some embodiments of the present application, and other drawings may be obtained from those drawings by those having ordinary skills in the art without any creative work.

Figure 1:
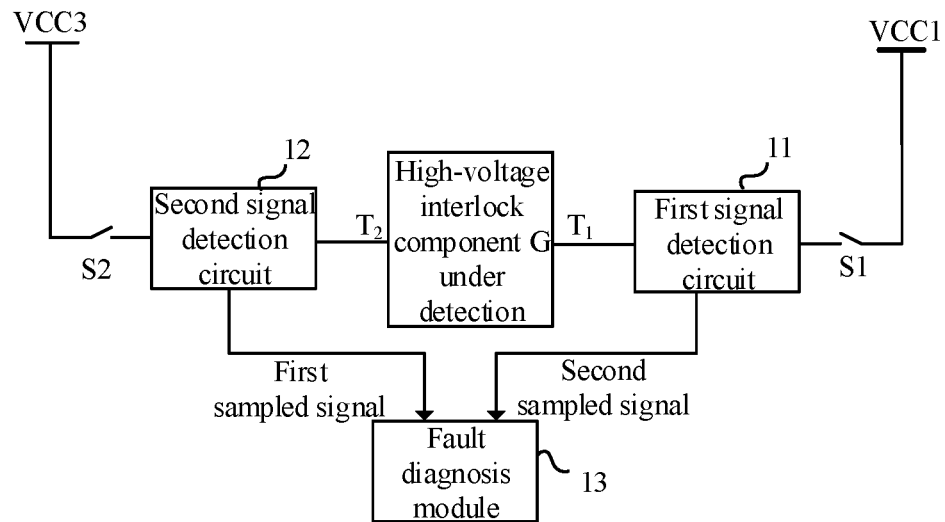
FIG. 1 is a schematic structural diagram of a high-voltage interlock device provided by an embodiment of the present application.

In the drawings, the drawings are not drawn to actual scale.

DETAILED DESCRIPTION

Implementations of the present application are described in further details below with reference to the drawings and embodiments. The following detailed description of the embodiments and drawings are used to illustrate principles of the present application exemplarily, instead of limiting the scope of the present application. That is, the present application is not limited to the described embodiments.

In the description of the application, it should be noted that, unless otherwise stated, "a plurality of" means two or more; the terms "top", "bottom", "left", "right", "inside", and "outside" used to indicate orientation or position relationships are only for purpose of facilitating the description of the application and simplifying the description, and do not indicate or imply that a device or element referred to must have a specific orientation, be constructed and operated in a specific orientation, and therefore cannot be understood as limitations to the application. In addition, the terms "first", "second", "third", etc. are only used for descriptive purposes, and cannot be understood as indicating or implying relative importance. "Vertical" is not strictly vertical, but within an allowable range of error. "Parallel" is not strictly parallel, but within an allowable range of error.

The orientation words appearing in the following description are all directions shown in the figures, and do not limit the specific structure of the application. In the description of the application, it should also be noted that, unless otherwise explicitly stated and defined, the terms "installation", "interconnection", and "connection" should be understood in a broad sense, for example, it may be a fixed connection or a detachable connection, an integral connection; it may be a direct connection or an indirect connection through an intermediate medium. For those of ordinary skills in the art, specific meanings of the above-mentioned terms in this application may be understood according to specific circumstances.

Embodiments of the present application provide a high-voltage interlock device and a detection method thereof, which are applicable to specific scenarios of fault detection for high-voltage devices. For a high-voltage interlock component under detection, if no fault occurs therein, the high-voltage interlock component under detection is in a normal state; if a fault occurs in the high-voltage interlock component under detection, the fault type may particularly include a short power supply fault, a short-ground fault and an open-circuit fault. The short power supply fault means that any or both ends of the high-voltage interlock component under detection are shorted to a power supply, which may be an unknown power supply. The short-ground fault means that any or both ends of the high-voltage interlock component under detection are shorted to the ground. The open-circuit fault means that an interior of the high-voltage interlock component under detection is always disconnected, that is, the interior of the high-voltage component under detection is always electrically disconnected.

FIG. 1 is a schematic structural diagram of a high-voltage interlock device, provided by an embodiment of the present application. In an embodiment, the high-voltage interlock device of the embodiment of the present application may be implemented as a high-voltage interlock circuit, or another structure that can realize the function of the high-voltage interlock device of the embodiment of the present application, which is not limited specifically herein.

As shown in FIG. 1, the high-voltage interlock device includes a first signal detection circuit 11, a second signal detection circuit 12, a first switch module S1, a second switch module S2 and a fault diagnosis module 13.

A first connection terminal of the first signal detection circuit 11 is connected to an end $T_1$ of a high-voltage interlock component G under detection, a second connection terminal of the first signal detection circuit 11 is connected to an end of the first switch module S1, an output terminal of the first signal detection circuit 11 is connected to the fault diagnosis module 13. The first signal detection circuit 11 is configured to collect a first original electric signal from the high-voltage interlock component G under detection and convert the first original electric signal into a first sampled signal while ensuring that the high-voltage interlock component G under detection is isolated from the fault diagnosis module 13.

A first connection terminal of the second signal detection circuit 12 is connected to another end $T_2$ of the high-voltage interlock component G under detection, a second connection terminal of the second signal detection circuit 12 is connected to an end of the second switch module S2, an output terminal of the second signal detection circuit 12 is connected to the fault diagnosis module 13. The second signal detection circuit 12 is configured to collect a second original electric signal from the high-voltage interlock component G under detection and convert the second original electric signal into a second sampled signal while ensuring that the high-voltage interlock component G under detection is isolated from the fault diagnosis module 13.

Another end of the first switch module S1 is connected to a first power terminal VCC1. In an embodiment, a voltage of the first power terminal VCC1 is less than or equal to a voltage of a low-voltage power supply in the vehicle. In an example, the first power terminal VCC1 may be a storage battery of the entire vehicle, such as a lead-acid storage battery or a lithium battery, which is not specifically limited.

Another end of the second switch module S2 is connected to a second power terminal VCC2. For the second power terminal VCC2, please refer to the related description about the first power terminal VCC1. The voltages of the first power terminal VCC1 and the second power terminal VCC2 can be the same. For example, a same power supply can be used, or different power supplies can be used, which is not limited.

The fault diagnosis module 13 is configured to determine a fault of the high-voltage interlock component G under detection according to the first sampled signal and/or the second sampled signal, under a condition that at least one of the first switch module S1 and the second switch module S2 is in an OFF state.

According to the high-voltage interlock device and the fault detection method thereof in the embodiments of the present application, the high-voltage interlock device includes the first signal detection circuit and the second signal detection circuit, and under the premise of ensuring that the high-voltage interlock component under detection is isolated from the fault diagnosis module, the first signal detection circuit and the second signal detection circuit can convert an electric signal at an end of the high-voltage interlock component under detection into an electric signal under detection and transmit the electric signal under detection to the fault diagnosis module to enable the fault diagnosis module to perform fault detection on the high-voltage interlock component under detection based on the electric signal under detection. There is no direct connection between the high-voltage interlock component under detection and the fault diagnosis module, and therefore the high-voltage interlock component under detection can be isolated from the fault diagnosis module, which avoids damage to the fault diagnosis module caused by a target electric signal output by the high-voltage interlock component under detection, and improves the safety of the high-voltage interlock device.

Figure 2:
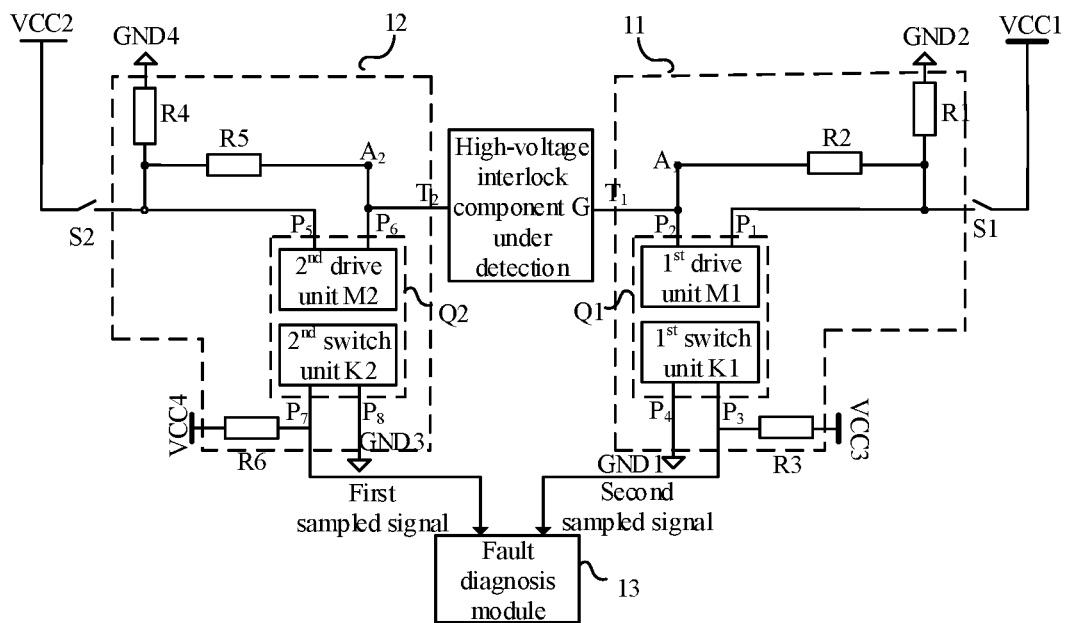
FIG. 2 is a schematic structural diagram of an exemplary high-voltage interlock device provided by an embodiment of the present application.

In some embodiments, FIG. 2 is a schematic structural diagram of an exemplary high-voltage interlock device provided by an embodiment of the present application. As shown in FIG. 2, the first signal detection circuit 11 includes a third switch module Q1, a first resistance module R1, a second resistance module R2, and a third resistance module R3.

Firstly, the third switch module Q1 includes a first drive unit M1 and a first switch unit K1 that are arranged in isolation. The first drive unit M1 and the first switch unit K1 are arranged in isolation, which means that there is no direct electrical connection between the first drive unit M1 and the first switch unit K1. The first resistance module R3 may include one or more resistors connected in parallel, series, or hybrid connection, etc.

Specifically, an end $P_2$ of the first drive unit M1 is used as the first connection terminal of the first signal detection circuit 11, and the end $P_2$ of the first drive unit M1 is further connected to an end of the second resistance module R2. Another end $P_1$ of the first drive unit K1 is used as the second connection terminal of the first signal detection circuit 11, the another end $P_1$ of the first drive unit K1 is further connected to an end of the first resistance module R1 and another end of the second resistance module R2, respectively. Illustratively, as shown in FIG. 2, a second reference potential may be provided by a second ground terminal GND2.

An end $P_3$ of the first switch unit K1 is connected to the fault diagnosis module 13, and the end $P_3$ of the first switch unit K1 is used as the output terminal of the first signal detection circuit 11. The end $P_3$ of the first switch unit K1 is further connected to a third power terminal VCC3 through the third resistance module R3. Another end $P_4$ of the first switch unit K1 is connected to a first reference potential. Illustratively, as shown in FIG. 2, the first reference potential may be provided by a first ground terminal GND1. In an embodiment, a voltage output from the third power terminal VCC3 is less than the voltage output from the first power terminal VCC1. The first power terminal VCC1 may be a low-voltage power supply for the vehicle, such as a lead-acid battery. Since the low-voltage power supply usually outputs a voltage of 12V or 24V, a value range of the third power terminal VCC3 can be (0,12V) and (0,24V), respectively. For example, the voltage of the third power terminal VCC3 may be 5V.

In an embodiment, the first drive unit M1 may convert electrical signals across the first drive unit M1 into another form of signals than the electrical signals, and transmit such another form of signals to the first switch unit K1. The first switch unit K1 responds to and converts such another form of signals into electrical signals. The first drive unit M1 may have unidirectional conductivity. When the voltage at the end $P_2$ of the first drive unit M1 is greater than the voltage at the another end $P_1$ of the first drive unit M1, the first drive unit M1 can drive the first switch unit K1 to be turned on. When the first switch unit K1 is turned on, a low-level signal may be collected from the another end $P_1$ of the first switch unit K1, and when the second switch unit K1 is turned off, a high-level signal may be collected from the another end $P_1$ of the first switch unit K1. The high-level signal and the low-level signal are relative terms. Comparing the voltage at the another end $P_1$ of the first switch unit K1 when the first switch unit K1 is turned on and the voltage at the another end $P_1$ of the first switch unit K1 when the first switch unit K1 is turned off, a signal having a higher voltage value is the high-level signal.

Figure 3:
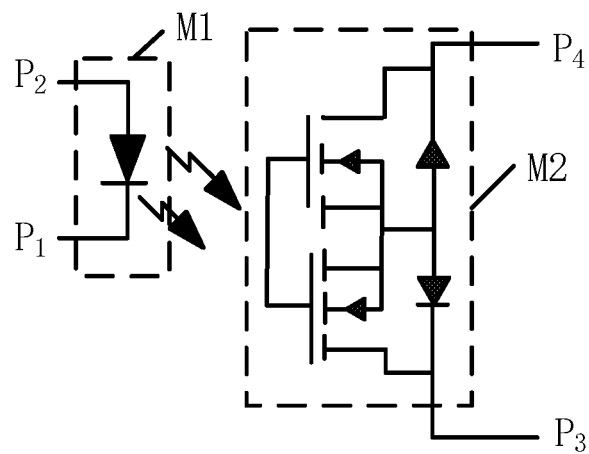
FIG. 3 is a schematic structural diagram of an exemplary second switch module provided by an embodiment of the present application.

Illustratively, if the another form of signals are optical signals, an exemplary third switch module as shown in FIG. 3 may be used in the embodiment of the present application. As shown in FIG. 3, the first drive unit M1 may include a light emitting element capable of converting an electric signal into an optical signal, such as a light emitting diode. A cathode of the light emitting diode serves as the another end $P_1$ of the first drive unit M1, and an anode of the light emitting diode serves as the end $P_2$ of the first drive unit M1. The first switch unit K1 may include an optical switch that converts an optical signal into an electrical signal, such as a photodiode, a phototransistor, a photoelectric metal oxide semiconductor field effect transistor (Metal Oxide Semiconductor, MOS), and the like. The first drive unit M1 and the first switch unit K1 can be selected appropriately according to a working scene and working requirements, and the specific implementation manner of the first drive unit M1 and the first switch unit K1 is not limited.

Secondly, for the first resistance module R1, the first resistance module R1 may include one or more resistors connected in parallel, series, or hybrid connection, etc. Specifically, the end of the first resistance module R1 is further connected to the another end of the second resistance module R2, and another end of the first resistance module R1 is connected to the second reference potential. Illustratively, as shown in FIG. 2, the second reference potential may be provided by the second ground terminal GND2.

Then, for the second resistance module R2 and the third resistance module R3, the second resistance module R2 and the third resistance module R3 may include one or more resistors connected in parallel, series, or hybrid connection, etc.

Figure 4:
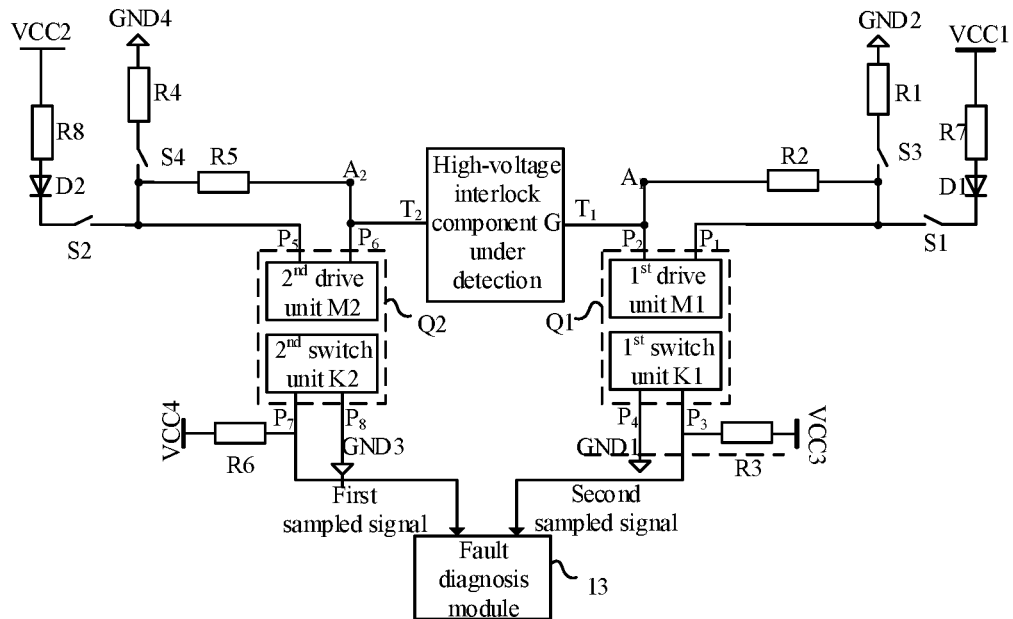
FIG. 4 is a schematic structural diagram of another high-voltage interlock device provided by an embodiment of the present application.

In an embodiment, the first signal detection circuit 11 further includes a seventh resistance module. The seventh resistance module is provided between the first power terminal VCC1 and the first switch module S1. Illustratively, FIG. 4 is a schematic structural diagram of another high-voltage interlock device provided by an embodiment of the present application. The seventh resistance module can be denoted as R7 in FIG. 3. The seventh resistance module R7 may include at least one resistor.

By providing the seventh resistance module R7, the seventh resistance module R7 has a current limiting function, which can prevent the third switch module Q1 and the fourth switch module Q2 from being damaged by overcurrent. It should be noted that other resistance modules in the embodiments of the present application also have a current limiting function, and can also prevent the third switch module Q1 and the fourth switch module Q2 from being damaged by overcurrent.

In an embodiment, the first signal detection circuit 11 further includes a first anti-reverse module. An input terminal of the first anti-reverse module is connected to the first power terminal, and an output terminal of the first anti-reverse module is connected to the end of the first switch module S1.

Illustratively, with continued reference to FIG. 3, the first anti-reverse module may be specifically implemented as a diode D1. The anode of the diode D1 is used as the input terminal of the first anti-reverse module. If the first signal detection circuit 11 does not include the seventh resistance module R7, the anode of the diode D1 is connected to the first power terminal VCC1.

If the first signal detection circuit 11 includes the seventh resistance module R7, the anode of the diode D1 is connected to the first power terminal VCC1 through the seventh resistance module R7. The cathode of the diode D1 serves as the output terminal of the first anti-reverse module and is connected to the first switch module S1. In addition, the positions of the seventh resistance module R7 and the first anti-reverse module can be interchanged, and the positions of the seventh resistance module R7 and the first anti-reverse module are not limited.

By providing the first anti-reverse module, the current in the high-voltage interlock device can be prevented from flowing into the first power terminal VCC1 and causing damage to the first power terminal VCC1.

In an embodiment, the first signal detection circuit 11 further includes a fifth switch module disposed between the first resistance module R1 and the second resistance module R2. Illustratively, the fifth switch module may be implemented as S3 in FIG. 3. The on-off state of S3 is synchronized with the on-off state of S2.

After the introduction of the first signal detection circuit 11, a specific description of the second signal detection circuit 12 will be provided in the following part of the present application.

In some embodiments, with continued reference to FIG. 2, the second signal detection circuit includes a fourth switch module Q2, a fourth resistance module R4, a fifth resistance module R5, and a sixth resistance module R6.

The fourth switch module Q2 includes a second drive unit M2 and a second switch unit K2 arranged in isolation.

An end $P_6$ of the second drive unit M2 serves as the first connection terminal of the second signal detection circuit 12, and the end $P_6$ of the second drive unit M2 is further connected to an end of the fifth resistance module R5. Another end $P_5$ of the second drive unit M2 serves as the second connection terminal of the second signal detection circuit 12, the another end $P_5$ of the second drive unit M2 is further connected to an end of the fourth resistance module R4 and another end of the fifth resistance module R5, respectively.

An end $P_7$ of the second switch unit K2 serves as the output terminal of the second signal detection circuit 12. The end $P_7$ of the second switch unit K2 is further connected to a fourth power terminal VCC4 through the sixth resistance module. For the specific content of the fourth power terminal VCC4, please refer to the related content of the third power terminal VCC3 in the above-mentioned embodiment of the present application, which will not be repeated here.

Another end $P_8$ of the second switch unit K2 is connected to the third reference potential. Illustratively, with continued reference to FIG. 2, the third reference potential may be provided by a third ground terminal GND3.

In addition, for the specific content of the second drive unit M2 and the second switch unit K2, please refer to the relevant description of the first drive unit M1 and the first switch unit K1 in the above-mentioned embodiment of the present application, which will not be repeated here.

The end of the fourth resistance module R4 is further connected to another end of the fifth resistance unit R5. Both the fourth resistance module R4 and the fifth resistance unit R5 may include one or more resistors connected in parallel, series, or hybrid connection, etc. For the specific content of the fourth resistance module R4, please refer to the related description of the first resistance module R1 in the above-mentioned embodiment of the present application, which will not be repeated here. For the specific content of the fifth resistance module R5, please refer to the related description of the second resistance module R2 in the above-mentioned embodiment of the present application, which will not be repeated here.

Another end of the fourth resistance module R4 is connected to a fourth reference potential. Illustratively, as shown in FIG. 1, the fourth reference potential may be provided by a fourth ground terminal GND4. It should be noted that the first ground terminal GND1 to the fourth ground terminal GND4 in the embodiments of the present application may be a same ground terminal or different ground terminals, which is not limited.

In an embodiment, the second signal detection circuit 12 further includes an eighth resistance module. The eighth resistance module is provided between the second power terminal VCC2 and the second switch module S2. Illustratively, the eighth resistance module can be denoted as R8 in FIG. 3. The eighth resistance module R8 may include at least one resistor.

In an embodiment, the second signal detection circuit 12 further includes a second anti-reverse module. An input terminal of the second anti-reverse module is connected to the second power terminal VCC2, and an output terminal of the second anti-reverse module is connected to the end of the second switch module S2. Illustratively, with continued reference to FIG. 4, the second anti-reverse module may be specifically implemented as a diode D2. For the specific content of the diode D2, please refer to the related description of the diode D1 in the above-mentioned embodiment of the present application, which will not be repeated here.

By providing the second anti-reverse module, the current in the high-voltage interlock device can be prevented from flowing into the second power terminal VCC2 and causing damage to the second power terminal VCC2.

In an embodiment, the second signal detection circuit 12 further includes a sixth switch module disposed between the fourth resistance module R4 and the fifth resistance module R5. Illustratively, the sixth switch module may be implemented as S4 in FIG. 4.

The high-voltage interlock device provided by the embodiment of the present application includes the third switch module and the fourth switch module, and both the third switch module and the fourth switch module include a drive unit and a switch unit that are arranged in isolation. The drive unit and the switch unit can convert an electric signal at an end of the high-voltage interlock component under detection into an electric signal under detection and transmit the electric signal under detection to the fault diagnosis module to enable the fault diagnosis module to perform fault detection on the high-voltage interlock component under detection based on the electric signal under detection. There is no direct connection between the high-voltage interlock component under detection and the fault diagnosis module, and therefore the high-voltage interlock component under detection can be isolated from the fault diagnosis module, which avoids damage to the fault diagnosis module caused by a target electric signal output by the high-voltage interlock component under detection, and improves the safety of the high-voltage interlock device.

After the introduction of the first signal detection circuit 11 and the second signal detection circuit 12, the fault diagnosis module 13 will be specifically described in the following parts of the embodiments of the present application.

Regarding the fault diagnosis module 13, the fault diagnosis module 13 is configured to determine, under a condition that at least one of the first switch module S1 and the second switch module S2 is in an OFF state, a fault of the high-voltage interlock component G under detection according to the first sampled signal at the end $P_3$ of the first switch unit K1 of the third switch module Q1 and/or the second sampled signal at the end $P_7$ of the second switch unit K2 of the fourth switch module Q2. The fault diagnosis module 13 may be specifically implemented as a Vehicle Control Unit (Vehicle Control Unit, VCU), a Motor Control Unit (Motor Control Unit, MCU), or a Battery Management System (Battery Management System, BMS) or other system or device with a processing function.

According to the high-voltage interlock device in the embodiments of the present application, the high-voltage interlock device includes the third switch module Q1 and the fourth switch module Q2, and both the third switch module Q1 and the fourth switch module Q2 include a drive unit and a switch unit arranged in isolation. The drive unit and the switch unit can convert an electrical signal at the end of the high-voltage interlock component under detection into an electrical signal under detection, and transmit the electrical signal under detection to the fault diagnosis module to enable the fault diagnosis module to perform fault detection on the high-voltage interlock component under detection based on the electric signal under detection. There is no direct connection between the high-voltage interlock component under detection and the fault diagnosis module, and therefore the high-voltage interlock component under detection can be isolated from the fault diagnosis module, which avoids damage to the fault diagnosis module caused by a target electric signal output by the high-voltage interlock component under detection, and improves the safety of the high-voltage interlock device.

In some embodiments of the present application, the condition where at least one of the first switch module S1 and the second switch module S2 is in the OFF state specifically includes three sub-conditions. The first sub-condition: both the first switch module S1 and the second switch module S2 are in the OFF state. The second sub-condition: the first switch module S1 is in the ON state and the second switch module S2 is in the OFF state. The third sub-condition: the first switch module S1 is in the OFF state and the second switch module S2 is in the ON state. The first sampled signal and the second sampled signal collected from the high-voltage interlock device shown in FIG. 1 will be described in detail below in conjunction with the above three sub-conditions and the state of the high-voltage interlock component G under detection. Details about the first sampled signal and the second sampled signal can be seen in Table 1 below. The symbol "&" in Table 1 means "and". For example, "S1 & S2 OFF" means both the first switch module S1 and the second switch module S2 are in the OFF state.

TABLE 1

| State of high-voltage interlock component G under detection | States of S1 and S2 | First sampled signal | Second sampled signal |
|---|---|---|---|
| Normal state | S1&S2 OFF | High-level signal | High-level signal |
|  | S1 ON & S2 OFF | High-level signal | Low-level signal |
|  | S1 OFF & S2 ON | Low-level signal | High-level signal |
| Short power supply fault | S1&S2 OFF | Low-level signal | Low-level signal |
|  | S1 ON & S2 OFF | Low-level signal | Low-level signal |
|  | S1 OFF & S2 ON | Low-level signal | Low-level signal |
| Open-circuit fault | S1&S2 OFF | High-level signal | High-level signal |
|  | S1 ON & S2 OFF | High-level signal | High-level signal |
|  | S1 OFF & S2 ON | High-level signal | High-level signal |
| Short-ground fault | S1&S2 OFF | High-level signal | High-level signal |
|  | S1 ON & S2 OFF | High-level signal | High-level signal |
|  | S1 OFF & S2 ON | High-level signal | High-level signal |

The first sampled signal and the second sampled signal will be specifically described in conjunction with Table 1 in the following parts of the embodiment.

(1) Assume the high-voltage interlock component G under detection is in a normal state. Referring to Table 1, when both the first switch module S1 and the second switch module S2 are in the OFF state, there is no current in the entire high-voltage interlock device at this time. Ideally, it can be considered that the voltages at both ends of the first drive unit M1 are equal, and the first drive unit M1 cannot drive the first switch unit K1 to be turned on. At this time, the first sampled signal is a low-level signal. Likewise, the voltages at both ends of the second drive unit M2 are also equal, the second switch unit K2 cannot be driven to be turned on, and the second sampled signal is also a low-level signal.

Under a condition that the first switch module S1 is turned on and the second switch module S2 is turned off, the current output from the first power terminal VCC1 has two transmission paths, respectively, the first transmission path: the first power terminal VCC1→the first switch module S1→the first resistance module R1→the second reference potential GND2; the second transmission path: the first power terminal VCC1→the first switch module S1→the second resistance module R2→the high-voltage interlock component G under detection→the fifth resistance module R5→the fourth resistance module R4→the fourth reference potential GND4. At this time, the voltage at the end $P_2$ of the first drive unit M1 is lower than the voltage at the another end $P_1$ of the first drive unit M1, the first drive unit M1 cannot drive the first switch unit K1 to be turned on, and the first sampled signal is a high-level signal. The voltage at the end $P_6$ of the second drive unit M2 is higher than the voltage at the another end $P_5$ of the second drive unit M2, the second drive unit M2 can drive the second switch unit M2 to be turned on, and the second sampled signal is a low-level signal.

Under a condition that the first switch module S1 is turned off and the second switch module S2 is turned on, the current output from the second power terminal VCC2 has two transmission paths, respectively, the first transmission path: the second power terminal VCC2→the second switch module S2→the fourth resistance module R4→the fourth reference potential GND4; the second transmission path: the second power terminal VCC2→the second switch module S2→the fifth resistance module R5→the high-voltage interlock component G under detection→the second resistance module R2→the first resistance module R1 the second reference potential GND2. At this time, the voltage at the end $P_2$ of the first drive unit M1 is higher than the voltage at the another end $P_1$ of the first drive unit M1, the first drive unit M1 can drive the first switch unit K1 to be turned on, and the first sampled signal is a low-level signal. The voltage at the end $P_6$ of the second drive unit M2 is lower than the voltage at the another end $P_5$ of the second drive unit M2, the second drive unit M2 cannot drive the second switch unit M2 to be turned on, and the second sampled signal is a high-level signal.

(2) Assume a short power supply fault occurs in the high-voltage interlock component G under detection. Continuing to refer to Table 1, no matter whether the first switch module S1 and the second switch module S2 are turned on or not, the voltage across the high-voltage interlock component G under detection is the voltage Vx of the shorted power supply, the voltage at the another end $P_2$ of the first drive unit M1 is always higher than the voltage at the end $P_1$ of the first drive unit M1, the voltage at the another end $P_6$ of the second drive unit M2 is always higher than the voltage at the end $P_5$ of the second drive unit M2, the first switch unit K1 and the second switch unit K2 are always in the ON state as driven by the first drive unit M1 and the second drive unit M2, and the first sampled signal and the second sampled signal are always low-level signals.

From Table 1, it can be found that under a condition that the first switch module S1 and the second switch module S2 are both in the OFF state, when the short power supply fault occurs in the high-voltage interlock component G under detection, the first sampled signal is a low-level signal, and the second sampled signal is a low-level signal. Under a condition that the first switch module S1 is in the ON state and the second switch module S2 is in the OFF state, when the short power supply fault occurs in the high-voltage interlock component G under detection, the first sampled signal is a low-level signal. Under a condition that the first switch module S1 is in the OFF state and the second switch module S2 is in the ON state, when the short power supply fault occurs in the high-voltage interlock component G under detection, the second sampled signal is a low-level signal.

Therefore, the short power supply fault of the high-voltage interlock component G under detection can be diagnosed according to the first sampled signal and/or the second sampled signal collected when the first switch module S1 and the second switch module S2 are both in the OFF state. The short power supply fault of the high-voltage interlock component G under detection can be diagnosed according to the first sampled signal collected when the first switch module S1 is in the ON state and the second switch module S2 is in the OFF state. The short power supply fault of the high-voltage interlock component G under detection can be diagnosed according to the second sampled signal collected when the first switch module S1 is in the OFF state and the second switch module S2 is in the ON state.

(3) Assume an open-circuit fault occurs in the high-voltage interlock component G under detection. Continuing to refer to Table 1, under a condition that the first switch module S1 and the second switch module S2 are both in the OFF state, the entire high-voltage interlock device has no current, and the first drive unit M1 cannot drive the first switch unit K1 to be turned on. At this time, the first sampled signal is a low-level signal. Likewise, the second drive unit M2 cannot drive the second switch unit K2 to be turned on either, and the second sampled signal is also a low-level signal.

Under a condition that the first switch module S1 is turned on and the second switch module S2 is turned off, the transmission path of the current output from the first power terminal VCC1 is the first power terminal VCC1→the first switch module S1→the first resistance module R1→the second reference potential GND2. The current flows through the first signal detection circuit 11, and there is no current in the second signal detection circuit 12. At this time, the voltage at the end $P_2$ of the first drive unit M1 is lower than the voltage at the another end $P_1$ of the first drive unit M1, the first drive unit M1 cannot drive the first switch unit K1 to be turned on, and the first sampled signal is at a high-level signal. The voltage at the end $P_6$ of the second drive unit M2 is equal to the voltage at the another end $P_5$ of the second drive unit M2, the second drive unit M2 cannot drive the second switch unit K2 to be turned on, and the second sampled signal is also a high-level signal.

Under a condition that the first switch module S1 is turned off and the second switch module S2 is turned on, the transmission path of the current output from the second power terminal VCC2 is the second power terminal VCC2→the second switch module S2→the fourth resistance module R4→the fourth reference potential GND4. The current flows through the second signal detection circuit 12, and there is no current in the first signal detection circuit 11. At this time, the voltage at the end $P_2$ of the first drive unit M1 is equal to the voltage at the another end $P_1$ of the first drive unit M1, the first drive unit M1 cannot drive the first switch unit K1 to be turned on, and the first sampled signal is a high-level signal. The voltage at the end $P_6$ of the second drive unit M2 is lower than the voltage at the another end $P_5$ of the second drive unit M2, the second drive unit M2 cannot drive the second switch unit K2 to be turned on, and the second sampled signal is also a high-level signal.

(4) Assume a short-ground fault occurs in the high-voltage interlock component G under detection. Continuing to refer to Table 1, no matter whether the first switch module S1 and the second switch module S2 are turned on or not, the voltage across the high-voltage interlock component G under detection is the reference potential (ideally regarded as 0), and the voltage at the end $P_2$ of the first drive unit M1 is not higher than the voltage at the another end $P_1$ of the first drive unit M1, the voltage at the end $P_6$ of the second drive unit M2 is not higher than the voltage at the another end $P_5$ of the second drive unit M2, the first drive unit M1 and the second drive unit M2 cannot drive the first switch unit K1 and the second switch unit K2 to be turned on, and the first sampled signal and the second sampled signal are high-level signals.

From Table 1, it can be found that when the open-circuit fault or the short-ground fault occurs in the high-voltage interlock component G under detection and when any one of the first switch module S1 and the second switch module S2 is closed, the first sampled signal and the second sampled signal are both high-level signals, which are different from the first sampled signal and the second sampled signal collected when the high-voltage interlock component G under detection is in the normal state.

Similarly, if the high-voltage interlock device further includes the fifth switch module S3 and/or the sixth switch module S4 as shown in FIG. 4, the first sampled signal and the second sampled signal under the three sub-conditions that at least one of the first switch module S1 and the second switch module S2 is in the OFF state conform to those shown in the above Table 1, and will not be repeated here.

Based on the above analysis, in the embodiment, the fault diagnosis module 13 can not only determine that a fault occurs in the high-voltage interlock component G under detection, but also can detect a specific fault type of the high-voltage interlock component G under detection.

Specifically, the fault diagnosis module 13 is specifically configured to: under a condition that both the first switch module S1 and the second switch module S2 are in the OFF state, determine that a short power supply fault occurs in the high-voltage interlock component under detection when the first sampled signal and/or the second sampled signal are low-level signals.

The fault diagnosis module 13 is further configured to: under a condition that the first switch module S1 is in the ON state and the second switch module S2 is in the OFF state, determine that the short power supply fault occurs in the high-voltage interlock component G under detection when the first sampled signal is a low-level signal, and determine that a short-ground fault or an open-circuit fault occurs in the high-voltage interlock component G under detection when the second sampled signal is a high-level signal.

The fault diagnosis module 13 is further configured to: under a condition that the first switch module S1 is in the OFF state and the second switch module S2 is in the ON state, determine that the short power supply fault occurs in the high-voltage interlock component G under detection when the second sampled signal is a low-level signal, and determine that the short-ground fault or the open-circuit fault occurs in the high-voltage interlock component G under detection when the first sampled signal is a high-level signal.

In addition, the fault diagnosis module 13 can also diagnose that the high-voltage interlock component G under detection is normal. Specifically, referring to Table 1, under a condition that one of the first switch module S1 and the second switch module S2 is in the ON state and the other of the first switch module S1 and the second switch module S2 is in the OFF state, when the first sampled signal and the second sampled signal have opposite levels, it is determined that the high-voltage interlock component G under detection is in the normal state.

In some embodiments, the high-voltage interlock device may further include a control module. Specifically, the control module is configured to control ON and OFF of the first switch module S1 and the second switch module S2 according to a preset control strategy. The function of the control module can be realized by the fault diagnosis module. For example, the control module may be specifically implemented as a VCU, a MCU or a BMS.

In an embodiment, the preset control strategy includes: controlling, in a first time period T1, the first switch module S1 and the second switch module S2 to be in the OFF state; controlling, after the first time period T1, the first switch module and the second switch module to be in the OFF state periodically and alternately. Specifically, a Pulse Width Modulation (Pulse Width Modulation, PWM) signal may be used to control the ON and OFF of the first switch module S1 and the second switch module S2. For example, in the first time period T1, the Pulse Width Modulation signal is not output to the first switch module S1 and the second switch module S2, and after the first time period T1, the PWM signal is output to the first switch module S1 and the second switch module S2 respectively, and the first switch module S1 and the second switch module S2 are maintained in mutually exclusive ON/OFF states, that is, when the first switch module S1 is open, the second switch module S2 is closed, and when the first switch module S1 is closed, the first switch module S2 is open.

Accordingly, corresponding to the preset control strategy, in an example, the fault diagnosis module 13 is specifically configured to: determine the fault of the high-voltage interlock component under detection according to a duty cycle of the first sampled signal and/or a duty cycle of the second sampled signal.

Firstly, in conjunction with the state of the high-voltage interlock component G under detection, the first sampled signal and the second sampled signal collected under the control of the control module are specifically described.

Figure 5A:
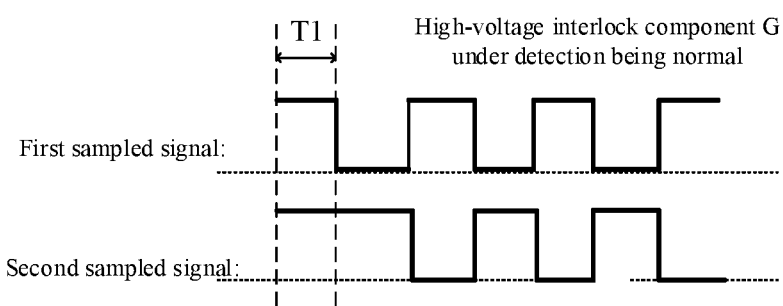
FIG. 5A is an exemplary waveform diagram of the first sampled signal and the second sampled signal corresponding to the high-voltage interlock component G under detection in a normal state, provided by an embodiment of the present application.

(1) Assuming the high-voltage interlock component G under detection is in the normal state, FIG. 5A is an exemplary waveform diagram of the first sampled signal and the second sampled signal corresponding to the high-voltage interlock component G under detection in the normal state, provided by an embodiment of the present application. As shown in FIG. 5A, in the first time period T1, both the first sampled signal and the second sampled signal are in a high-level state. After the first time period T1, the first sampled signal and the second sampled signal have opposite levels, that is, when the first sampled signal is a high-level signal, the second sampled signal is a low-level signal.

Figure 5B:
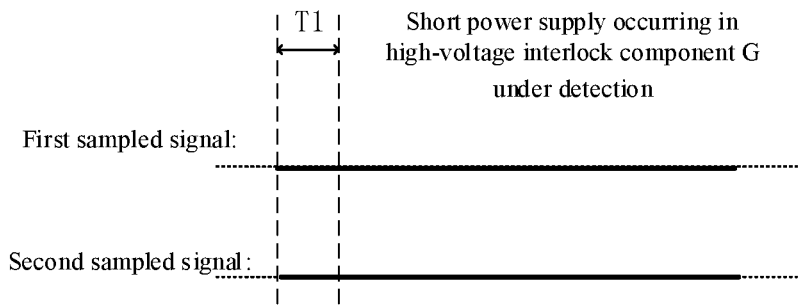
FIG. 5B is an exemplary waveform diagram of the first sampled signal and the second sampled signal corresponding to the high-voltage interlock component G under detection with a short power supply fault, provided by an embodiment of the present application.

(2) Assuming the short power supply fault occurs in the high-voltage interlock component G under detection, FIG. 5B is an exemplary waveform diagram of the first sampled signal and the second sampled signal corresponding to the high-voltage interlock component G under detection with the short power supply fault, provided by an embodiment of the present application. As shown in FIG. 5B, the first sampled signal and the second sampled signal are both low-level signals.

Figure 5C:
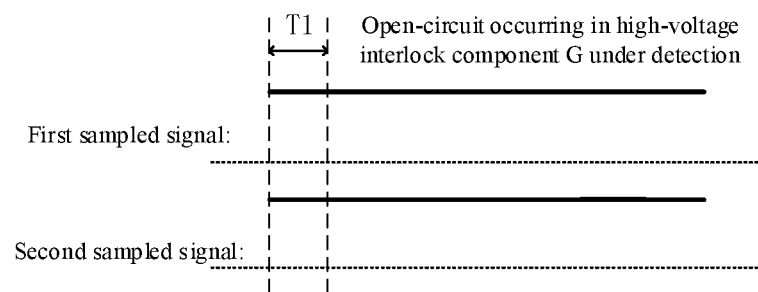
FIG. 5C is an exemplary waveform diagram of the first sampled signal and the second sampled signal corresponding to the high-voltage interlock component G under detection with an open-circuit fault, provided by an embodiment of the present application.

(3) Assuming the open-circuit fault occurs in the high-voltage interlock component G under detection, FIG. 5C is an exemplary waveform diagram of the first sampled signal and the second sampled signal corresponding to the high-voltage interlock component G under detection with the open-circuit fault, provided by an embodiment of the present application. As shown in FIG. 5C, the first sampled signal and the second sampled signal are both high-level signals.

Figure 5D:
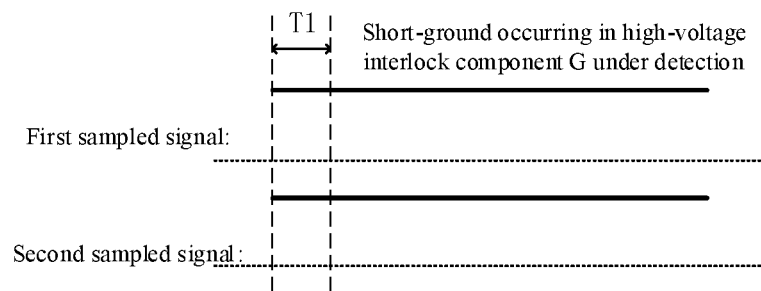
FIG. 5D is an exemplary waveform diagram of the first sampled signal and the second sampled signal corresponding to the high-voltage interlock component G under detection with a short-ground fault, provided by an embodiment of the present application.

(4) Assuming the short-ground fault occurs in the high-voltage interlock component G under detection, FIG. 5D is an exemplary waveform diagram of the first sampled signal and the second sampled signal corresponding to the high-voltage interlock component G under detection with the short-ground fault, provided by an embodiment of the present application. As shown in FIG. 5D, the first sampled signal and the second sampled signal are both high-level signals.

From the comparison of FIGS. 5A-5D, it can be seen that when the high-voltage interlock component G under detection is normal, both the duty cycle of the first sampled signal and the duty cycle of the second sampled signal are greater than 0 and less than 1. Illustratively, under a condition that the signal controlling the first switch module S1 and the second switch module S2 is a PWM signal and a switch module will be turned on when the PWM signal applied to the switch module is at a high level, when the first time period T1 is sufficiently short, it can be approximately considered that the duty cycle of the first sampled signal is equal to the duty cycle of the PWM signal applied to the first switch module S1 and the duty cycle of the second sampled signal is equal to the duty cycle of the PWM signal applied to the second switch module S2. Conversely, under a condition that the switch module is turned off when the PWM signal applied to the switch module is at a high level, it can be approximately considered that a sum of the duty cycle of the first sampled signal and the duty cycle of the PWM signal applied to the first switch module S1 is 1, and a sum of the duty cycle of the second sampled signal and the duty cycle of the PWM signal applied to the second switch module S2 is 1. If the short power supply fault occurs in the high-voltage interlock component G under detection, ideally the duty cycle of the first sampled signal and the duty cycle of the second sampled signal can be considered to be equal to 0. If the open-circuit fault or the short-ground fault occurs in the high-voltage interlock component G under detection, ideally the duty cycle of the first sampled signal and the duty cycle of the second sampled signal can be considered to be equal to 1.

Accordingly, the fault diagnosis module 13 may be specifically configured to: determine that a short power supply fault occurs in the high-voltage interlock component G under detection when the duty cycle of the first sampled signal is 0 and/or the duty cycle of the second sampled signal is 0.

The fault diagnosis module 13 may be further configured to: determine that an open-circuit fault or a short-ground fault occurs in the high-voltage interlock component under detection when the duty cycle of the first sampled signal is 1 and/or the duty cycle of the second sampled signal is 1.

In addition, the fault diagnosis module 13 may further determine that the high-voltage interlock component G under detection is in a normal state. Accordingly, the fault diagnosis module 13 is further configured to determine that the high-voltage interlock component G under detection is in the normal state when the duty cycle of the first sampled signal is greater than 0 and less than 1 and/or the duty cycle of the second sampled signal is greater than 0 and less than 1.

In another example, corresponding to the preset control strategy, the fault diagnosis module 13 may also be specifically configured to: determine the fault of the high voltage interlock component under detection according to the waveform diagram of the first sampled signal and/or the waveform diagram of the second sampled signal. Reference may be made to FIGS. 5A to 5C for details, which will not be repeated here.

In some embodiments, in order to improve diagnostic accuracy of the high-voltage interlock device, the fault diagnosis module 13 is also connected to the end $T_1$ of the high-voltage interlock component G under detection, so as to directly collect a third sampled signal from the end $T_1$ of the high-voltage interlock component G under detection. Accordingly, the fault diagnosis module 13 may be specifically configured to: determine the fault of the high-voltage interlock component under detection according to the first sampled signal, the second sampled signal, and the third sampled signal, under a condition that at least one of the first switch module S1 and the second switch module S2 is in the OFF state. Illustratively, continuing to refer to FIGS. 2 and 3, the fault diagnosis module 13 may collect the third sampled signal from a sampling point $A_1$. When a potential of the sampling point $A_1$ is greater than 0, the third sampled signal is a high-level signal; when the potential of the sampling point $A_1$ is equal to 0, the third sampled signal is a low-level signal.

For the specific content of the first sampled signal and the second sampled signal, please refer to the relevant description in the foregoing embodiments of the present application, which is not repeated here. The third sampled signal will be specifically described in the following parts of the embodiment of the present application in conjunction with the state of the high-voltage interlock component G under detection. Details about the third sampled signal can be seen in Table 2 below.

TABLE 2

| State of high-voltage interlock component G under detection | States of S1 and S2 | First sampled signal | Second sampled signal | Third sampled signal |
|---|---|---|---|---|
| Normal state | S1&S2 OFF | High-level signal | High-level signal | Low-level signal |
|  | S1 ON & S2 OFF | High-level signal | Low-level signal | High-level signal |
|  | S1 OFF & S2 ON | Low-level signal | High-level signal | High-level signal |
| Short power supply fault | S1&S2 OFF | Low-level signal | Low-level signal | High-level signal |
|  | S1 ON & S2 OFF | Low-level signal | Low-level signal | High-level signal |
|  | S1 OFF & S2 ON | Low-level signal | Low-level signal | High-level signal |

TABLE 2-continued

| State of high-voltage interlock component G under detection | States of S1 and S2 | First sampled signal | Second sampled signal | Third sampled signal |
|---|---|---|---|---|
| Open-circuit fault | S1&S2 OFF | High-level signal | High-level signal | Low-level signal |
| | S1 ON & S2 OFF | High-level signal | High-level signal | High-level signal |
| | S1 OFF & S2 ON | High-level signal | High-level signal | Low-level signal |
| Short-ground fault | S1&S2 OFF | High-level signal | High-level signal | Low-level signal |
| | S1 ON & S2 OFF | High-level signal | High-level signal | Low-level signal |
| | S1 OFF & S2 ON | High-level signal | High-level signal | Low-level signal |

The third sampled signal will be specifically described in conjunction with Table 2 in the following parts of the embodiment.

(1) Assume the high-voltage interlock component G under detection is in a normal state. Referring to Table 2, when the first switch module S1 and the second switch module S2 are both in the OFF state, there is no current in the entire high-voltage interlock device. Ideally, it can be considered that the potential of the sampling point $A_1$ is equal to 0, and the third sampled signal is a low-level signal at this time.

When the first switch module S1 is turned on and the second switch module S2 is turned off, the current output from the first power terminal VCC1 can flow to the second reference potential GND2 and the fourth reference potential GND4 through the sampling point A1, respectively. At this time, the voltage of the first power terminal VCC1 can be applied to the sampling point $A_1$, and the third sampled signal is a high-level signal.

When the first switch module S1 is turned off and the second switch module S2 is turned on, the current output from the second power terminal VCC2 can flow to the second reference potential GND2 through the sampling point $A_1$, and the third sampled signal is a high-level signal.

(2) Assume a short power supply fault occurs in the high-voltage interlock component G under detection. Continuing to refer to Table 2, the potential of the sampling point $A_1$ can be considered to be approximately equal to the potential of the end $T_1$ of the high-voltage interlock component G under detection. Since the voltage across the high-voltage interlock component G under detection is always the voltage Vx of the shorted power supply, the third sampled signal is a high-level signal no matter whether the first switch module S1 and the second switch module S2 are turned on or not.

(3) Assume an open-circuit fault occurs in the high-voltage interlock component G under detection. Continuing to refer to Table 2, when the first switch module S1 and the second switch module S2 are both in the OFF state, there is no current in the entire high-voltage interlock device. It can be approximately considered that the potential of the sampling point $A_1$ is equal to 0, and the third sampled signal is a low-level signal at this time.

When the first switch module S1 is turned on and the second switch module S2 is turned off, the voltage of the first power terminal VCC1 can be applied to the sampling point $A_1$, and the third sampled signal is a high-level signal.

When the first switch module S1 is turned off and the second switch module S2 is turned on, since the high-voltage interlock component G under detection is disconnected, the voltage of the second power terminal VCC2 can be applied to the sampling point $A_1$, and the third sampled signal is a low-level signal.

(4) Assuming a short-ground fault occurs in the high-voltage interlock component G under detection, the potential of the sampling point $A_1$ can be considered to be approximately equal to the potential of the end $T_1$ of the high-voltage interlock component G under detection. Since the voltage across the high-voltage interlock component G under detection is the ground voltage, the third sampled signal is a low-level signal no matter whether the first switch module S1 and the second switch module S2 are turned on or not.

From Table 2 and the above analysis content, it can be seen that when the first switch module S1 and the second switch module S2 are both open and when the short power supply fault occurs in the high-voltage interlock component G under detection, the third sampled signal is a high-level signal. When the first switch module S1 is closed and the second switch module S2 is open, the third sampled signal corresponding to the high-voltage interlock component G under detection having the open-circuit fault is a high-level signal, and the third sampled signal corresponding to the high-voltage interlock component G under detection having the short-ground fault is a low-level signal.

Accordingly, the fault diagnosis module 13 is specifically configured to: under a condition that both the first switch module S1 and the second switch module S2 are in the OFF state, determine that a short power supply fault occurs in the high-voltage interlock component G under detection when the first sampled signal is a low-level signal, the second sampled signal is a low-level signal, or the third sampled signal is a high-level signal.

The fault diagnosis module 13 is further configured to: under a condition that the first switch module S1 is in the ON state and the second switch module S2 is in the OFF state, determine that the short power supply fault occurs in the high-voltage interlock component G under detection when the first sampled signal is a low-level signal, determine that a short-ground fault occurs in the high-voltage interlock component G under detection when the third sampled signal is a low-level signal, and determine that an open-circuit fault occurs in the high-voltage interlock component G under detection when both the second sampled signal and the third sampled signal are high-level signals;

The fault diagnosis module 13 is further configured to: under a condition that the first switch module S1 is in the OFF state and the second switch module S2 is in the ON state, determine that the short power supply fault occurs in the high-voltage interlock component G under detection when the second sampled signal is a low-level signal, and determine that the short-ground fault or the open-circuit fault occurs in the high-voltage interlock component G under detection when the first sampled signal is a high-level signal and/or the third sampled signal is a low-level signal.

In some embodiments, the control module is configured to control ON and OFF of the first switch module S1 and the second switch module S2 according to the above preset control strategy. In an example, the fault diagnosis module 13 is specifically configured to: determine the fault of the high-voltage interlock component G under detection according to at least one of a duty cycle of the first sampled signal, a duty cycle of the second sampled signal and a duty cycle of the third sampled signal.

Firstly, in conjunction with the state of the high-voltage interlock component G under detection, the third sampled signal collected under the control of the control module is specifically described. For the relevant content of the first sampled signal and the second sampled signal, please refer to the specific description of the first sampled signal and the second sampled signal in the foregoing embodiments of the present application in conjunction with FIG. 5A to FIG. 5D, which will not be repeated here.

Figure 6A:
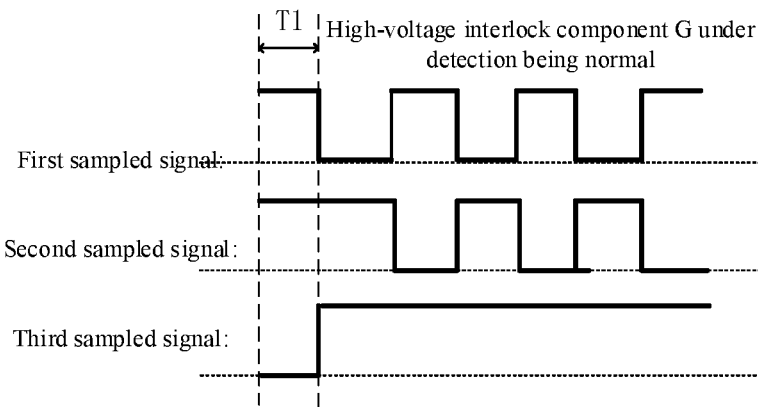
FIG. 6A is an exemplary waveform diagram of the first sampled signal, the second sampled signal and the third sampled signal corresponding to the high-voltage interlock component G under detection in a normal state, provided by an embodiment of the present application.

(1) Assuming the high-voltage interlock component G under detection is in the normal state, FIG. 6A is an exemplary waveform diagram of the first sampled signal, the second sampled signal and the third sampled signal corresponding to the high-voltage interlock component G under detection in the normal state, provided by an embodiment of the present application. As shown in FIG. 6A, in the first time period T1, the third sampled signal is a low-level signal. After the first time period T1, the third sampled signal is a high-level signal.

Figure 6B:
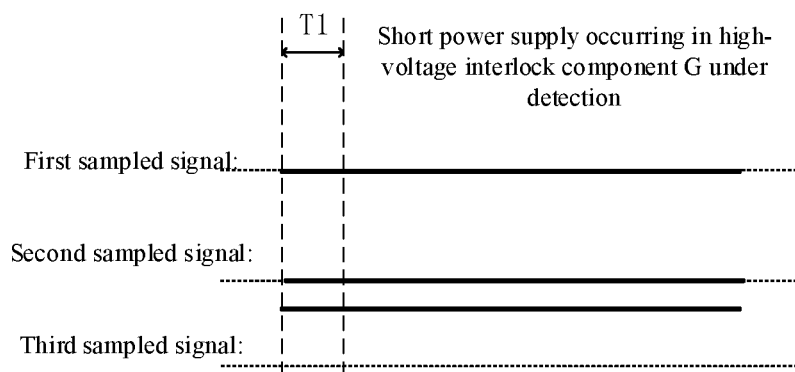
FIG. 6B is an exemplary waveform diagram of the first sampled signal, the second sampled signal and the third sampled signal corresponding to the high-voltage interlock component G under detection with a short power supply fault, provided by an embodiment of the present application.

(2) Assuming the short power supply fault occurs in the high-voltage interlock component G under detection, FIG. 6B is an exemplary waveform diagram of the first sampled signal, the second sampled signal and the third sampled signal corresponding to the high-voltage interlock component G under detection with the short power supply fault, provided by an embodiment of the present application. As shown in FIG. 6B, the third sampled signal is always a high-level signal.

Figure 6C:
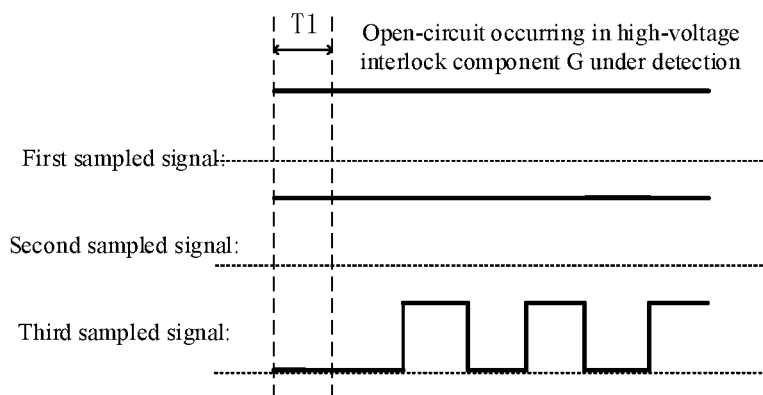
FIG. 6C is an exemplary waveform diagram of the first sampled signal, the second sampled signal and the third sampled signal corresponding to the high-voltage interlock component G under detection with an open-circuit fault, provided by an embodiment of the present application.

(3) Assuming the open-circuit fault occurs in the high-voltage interlock component G under detection, FIG. 6C is an exemplary waveform diagram of the first sampled signal, the second sampled signal and the third sampled signal corresponding to the high-voltage interlock component G under detection with the open-circuit fault, provided by an embodiment of the present application. As shown in FIG. 6C, in the first time period T1, the third sampled signal is a low-level signal. After the first time period T1, the third sampled signal is the PWM signal.

Figure 6D:
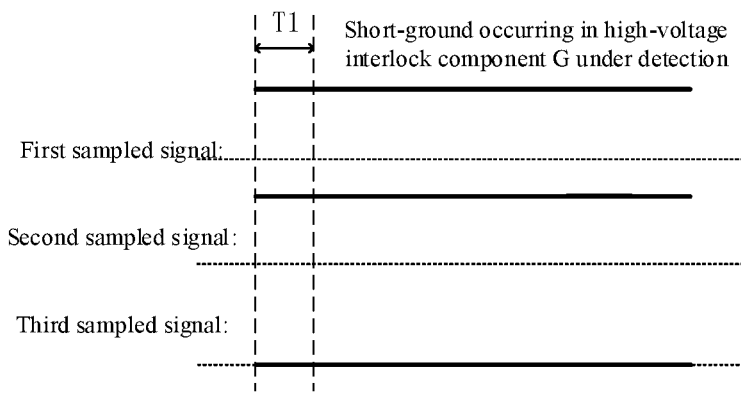
FIG. 6D is an exemplary waveform diagram of the first sampled signal, the second sampled signal and the third sampled signal corresponding to the high-voltage interlock component G under detection with a short-ground fault, provided by an embodiment of the present application.

(4) Assuming the short-ground fault occurs in the high-voltage interlock component G under detection, FIG. 6D is an exemplary waveform diagram of the first sampled signal, the second sampled signal and the third sampled signal corresponding to the high-voltage interlock component G under detection with the short-ground fault, provided by an embodiment of the present application. As shown in FIG. 6D, the third sampled signal is always a low-level signal.

From the comparison of FIGS. 6A-6D, it can be seen that when the high-voltage interlock component G under detection is normal, the duty cycle of the third sampled signal is equal to $1-T1/T0$, where T0 is a total time period. When the short power supply fault occurs in the high-voltage interlock component G under detection, the duty cycle of the third sampled signal is equal to 1. Assuming the short-ground fault occurs in the high-voltage interlock component G under detection, the duty cycle of the third sampled signal is equal to 0. When the open-circuit fault occurs in the high-voltage interlock component G under detection, when the first time period T1 is sufficiently short, under a condition that the signal controlling the first switch module S1 and the second switch module S2 is a PWM signal and the first switch module S1 is turned on when the PWM signal applied to the first switch module S1 is at a high level, it can be approximately considered that the duty cycle of the third sampled signal is equal to the duty cycle of the PWM signal applied to the first switch module S1. Conversely, under a condition that the first switch module S1 is turned off when the PWM signal applied to the first switch module S1 is at a high level, it can be approximately considered that a sum of the duty cycle of the third sampled signal and the duty cycle of the PWM signal applied to the first switch module S1 is 1.

Accordingly, on the basis of the specific functions of the fault diagnosis module 13 described in the above embodiments in conjunction with FIGS. 6A-6D, the fault diagnosis module 13 may be further configured to: determine that a short power supply fault occurs in the high-voltage interlock component G under detection when the duty cycle of the third sampled signal is 1.

The fault diagnosis module 13 may be further configured to: determine that a short-ground fault occurs in the high-voltage interlock component under detection when the duty cycle of the third sampled signal is 0.

The fault diagnosis module 13 may be further configured to: determine that an open-circuit fault occurs in the high-voltage interlock component under detection when the duty cycle of the third sampled signal is approximately equal to the duty cycle of the PWM signal applied to the first switch module S1.

In addition, the fault diagnosis module 13 may further determine that the high-voltage interlock component G under detection is in a normal state. Accordingly, the fault diagnosis module 13 is further configured to determine that the high-voltage interlock component G under detection is in the normal state when the duty cycle of the third sampled signal is equal to $1-T1/T0$.

In another example, the fault diagnosis module 13 is specifically configured to: determine the fault of the high voltage interlock component G under detection according to at least one of the waveform diagram of the first sampled signal, the waveform diagram of the second sampled signal and the waveform diagram of the third sampled signal. Reference may be made to FIGS. 6A to 6D for details, which will not be repeated here.

In some embodiments, in order to improve diagnostic accuracy of the high-voltage interlock device, in addition to the connection with the end $T_1$ of the high-voltage interlock component G under detection, the fault diagnosis module 13 is also connected to the another end $T_2$ of the high-voltage interlock component G under detection, so as to directly collect a fourth sampled signal from the another end $T_2$ of the high-voltage interlock component G under detection. Accordingly, the fault diagnosis module 13 may be specifically configured to: determine the fault of the high-voltage interlock component G under detection according to the first sampled signal, the second sampled signal, the third sampled signal and the fourth sampled signal, under a condition that at least one of the first switch module S1 and the second switch module S2 is in the OFF state. Illustratively, continuing to refer to FIGS. 1 and 2, the fault diagnosis module 13 may collect the fourth sampled signal from a sampling point $A_2$. When a potential of the sampling point $A_2$ is greater than 0, the fourth sampled signal is a high-level signal; when the potential of the sampling point $A_2$ is equal to 0, the fourth sampled signal is a low-level signal.

For the specific content of the first sampled signal, the second sampled signal and the third sampled signal, please refer to the relevant description in the foregoing embodiments of the present application, which is not repeated here. The fourth sampled signal will be specifically described in the following parts of the embodiment of the present application in conjunction with the state of the high-voltage interlock component G under detection. Details about the fourth sampled signal can be seen in Table 3 below.

TABLE 3

| State of high-voltage interlock component G under detection | States of S1 and S2 | First sampled signal | Second sampled signal | Third sampled signal | Fourth sampled signal |
| --- | --- | --- | --- | --- | --- |
| Normal state | S1&S2 OFF | High-level | High-level | Low-level | Low-level |
| | S1 ON & S2 OFF | High-level | Low-level | High-level | High-level |
| | S1 OFF & S2 ON | Low-level | High-level | High-level | High-level |
| Short power supply fault | S1&S2 OFF | Low-level | Low-level | High-level | High-level |
| | S1 ON & S2 OFF | Low-level | Low-level | High-level | High-level |
| | S1 OFF & S2 ON | Low-level | Low-level | High-level | High-level |
| Open-circuit fault | S1&S2 OFF | High-level | High-level | Low-level | Low-level |
| | S1 ON & S2 OFF | High-level | High-level | High-level | Low-level |
| | S1 OFF & S2 ON | High-level | High-level | Low-level | High-level |
| Short-ground fault | S1&S2 OFF | High-level | High-level | Low-level | Low-level |
| | S1 ON & S2 OFF | High-level | High-level | Low-level | Low-level |
| | S1 OFF & S2 ON | High-level | High-level | Low-level | Low-level |

The fourth sampled signal will be specifically described in conjunction with Table 3 in the following parts of the embodiment.

(1) Assume the high-voltage interlock component G under detection is in a normal state. Referring to Table 3, the principle and the level of the fourth sampled signal are the same as those of the third sampled signal, which will not be repeated here.

(2) Assume a short power supply fault occurs in the high-voltage interlock component G under detection. Continuing to refer to Table 3, the principle and the level of the fourth sampled signal are the same as those of the third sampled signal, which will not be repeated here.

(3) Assume an open-circuit fault occurs in the high-voltage interlock component G under detection. Continuing to refer to Table 3, when both the first switch module S1 and the second switch module S2 are in the OFF state, the principle and the level of the fourth sampled signal are the same as those of the third sampled signal, which will not be repeated here.

When the first switch module S1 is turned on and the second switch module S2 is turned off, since the high-voltage interlock component G under detection is always in the OFF state, the voltage of the first power terminal VCC2 cannot be applied to the sampling point A2, and the third sampled signal is a low-level signal.

When the first switch module S1 is turned off and the second switch module S2 is turned on, the voltage of the second power terminal VCC2 can be applied to the sampling point A2, and the third sampled signal is a low-level signal.

(4) Assume a short-ground fault occurs in the high-voltage interlock component G under detection, the principle and the level of the fourth sampled signal are the same as those of the third sampled signal, which will not be repeated here.

From Table 3 and the above analysis content, it can be seen that when the first switch module S1 and the second switch module S2 are both open and when the short power supply fault occurs in the high-voltage interlock component G under detection, the fourth sampled signal is a high-level signal. When the first switch module S1 is open and the second switch module S2 is closed, the fourth sampled signal corresponding to the high-voltage interlock component G under detection having the open-circuit fault is a high-level signal, and the fourth sampled signal corresponding to the high-voltage interlock component G under detection having the short-ground fault is a low-level signal.

Accordingly, the fault diagnosis module 13 is specifically configured to: under a condition that both the first switch module S1 and the second switch module S2 are in the OFF state, determine that a short power supply fault occurs in the high-voltage interlock component G under detection when the first sampled signal is a low-level signal, the second sampled signal is a low-level signal, the third sampled signal is a high-level signal, or the fourth sampled signal is a high-level signal.

The fault diagnosis module 13 is further configured to: under a condition that the first switch module S1 is in the ON state and the second switch module S2 is in the OFF state, determine that the short power supply fault occurs in the high-voltage interlock component G under detection when the first sampled signal is a low-level signal, determine that a short-ground fault occurs in the high-voltage interlock component G under detection when the third sampled signal is a low-level signal, and determine that an open-circuit fault occurs in the high-voltage interlock component G under detection when both the second sampled signal and the third sampled signal are high-level signals or when the third sampled signal is a high-level signal and the fourth sampled signal is a low-level signal.

The fault diagnosis module 13 is further configured to: under a condition that the first switch module S1 is in the OFF state and the second switch module S2 is in the ON state, determine that the short power supply fault occurs in the high-voltage interlock component G under detection when the second sampled signal is a low-level signal, determine that the short-ground fault occurs in the high-voltage interlock component G under detection when the fourth sampled signal is a low-level signal, and determine that the open-circuit fault occurs in the high-voltage interlock component G under detection when both the first sampled signal and the fourth sampled signal are high-level signals or when the third sampled signal is a low-level signal and the fourth sampled signal is a high-level signal.

With the embodiments of the present application, when one of the first switch module S1 and the second switch module S2 is controlled to be in the ON state and the other is controlled to be in the OFF state, the specific fault type of the high-voltage interlock component G under detection can be diagnosed. There is no need to control the first switch module S1 and the second switch module S2 to be turned off alternately.

In some embodiments, the control module is configured to control ON and OFF of the first switch module S1 and the second switch module S2 according to the above preset control strategy. In an example, the fault diagnosis module 13 is specifically configured to: determine the fault of the high-voltage interlock component G under detection according to at least one of a duty cycle of the first sampled signal, a duty cycle of the second sampled signal, a duty cycle of the third sampled signal and a duty cycle of the fourth sampled signal.

Firstly, in conjunction with the state of the high-voltage interlock component G under detection, the fourth sampled signal collected under the control of the control module is specifically described. For the relevant content of the first sampled signal, the second sampled signal and the third sampled signal, please refer to the specific description of the first sampled signal, the second sampled signal and the third sampled signal in the foregoing embodiments of the present application in conjunction with FIG. 5A to FIG. 5D and FIG. 6A to FIG. 6D, which will not be repeated here.

Figure 7A:
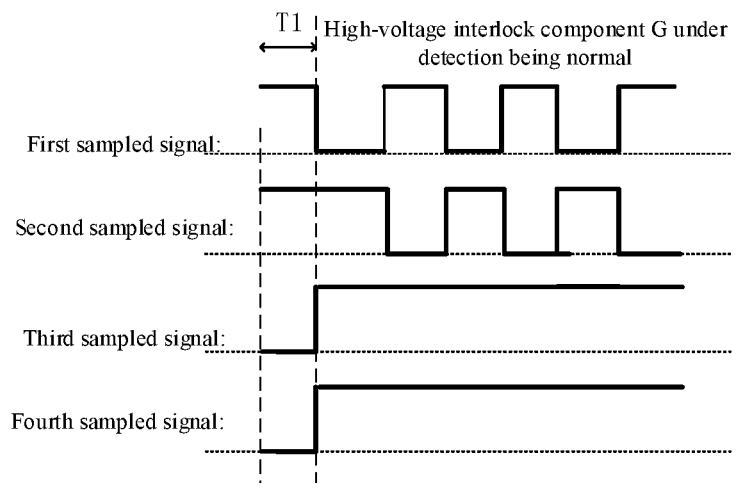
FIG. 7A is an exemplary waveform diagram of the first sampled signal, the second sampled signal, the third sampled signal and the fourth sampled signal corresponding to the high-voltage interlock component G under detection in a normal state, provided by an embodiment of the present application.

(1) Assuming the high-voltage interlock component G under detection is in the normal state, FIG. 7A is an exemplary waveform diagram of the first sampled signal, the second sampled signal, the third sampled signal and the fourth sampled signal corresponding to the high-voltage interlock component G under detection in the normal state, provided by an embodiment of the present application. As shown in FIG. 7A, in the first time period T1, the fourth sampled signal is a low-level signal. After the first time period T1, the fourth sampled signal is a high-level signal.

Figure 7B:
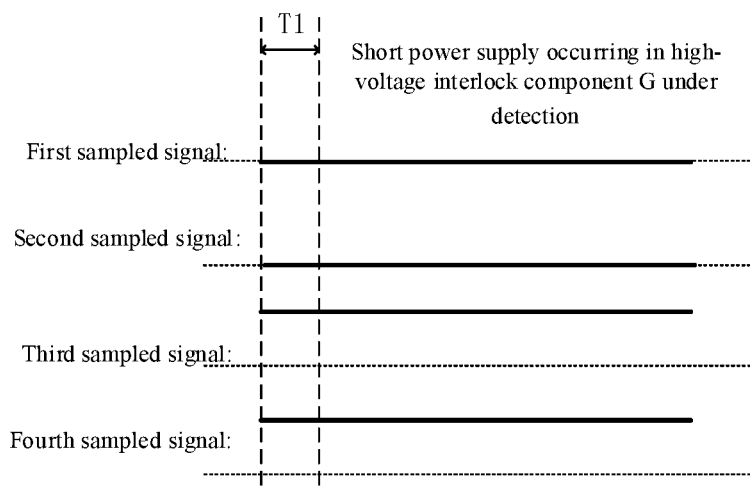
FIG. 7B is an exemplary waveform diagram of the first sampled signal, the second sampled signal, the third sampled signal and the fourth sampled signal corresponding to the high-voltage interlock component G under detection with a short power supply fault, provided by an embodiment of the present application.

(2) Assuming the short power supply fault occurs in the high-voltage interlock component G under detection, FIG. 7B is an exemplary waveform diagram of the first sampled signal, the second sampled signal, the third sampled signal and the fourth sampled signal corresponding to the high-voltage interlock component G under detection with the short power supply fault, provided by an embodiment of the present application. As shown in FIG. 7B, the fourth sampled signal is a high-level signal.

Figure 7C:
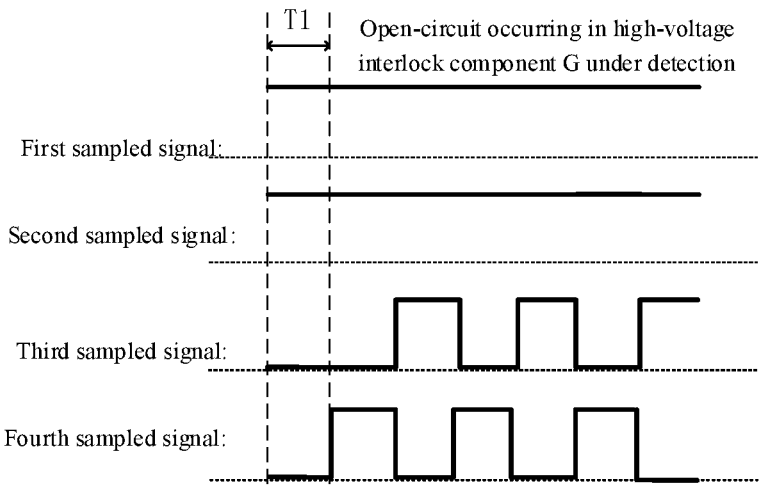
FIG. 7C is an exemplary waveform diagram of the first sampled signal, the second sampled signal, the third sampled signal and the fourth sampled signal corresponding to the high-voltage interlock component G under detection with an open-circuit fault, provided by an embodiment of the present application.

(3) Assuming the open-circuit fault occurs in the high-voltage interlock component G under detection, FIG. 7C is an exemplary waveform diagram of the first sampled signal, the second sampled signal, the third sampled signal and the fourth sampled signal corresponding to the high-voltage interlock component G under detection with the open-circuit fault, provided by an embodiment of the present application. As shown in FIG. 7C, in the first time period T1, the fourth sampled signal is a low-level signal. After the first time period T1, the fourth sampled signal is the PWM signal.

Figure 7D:
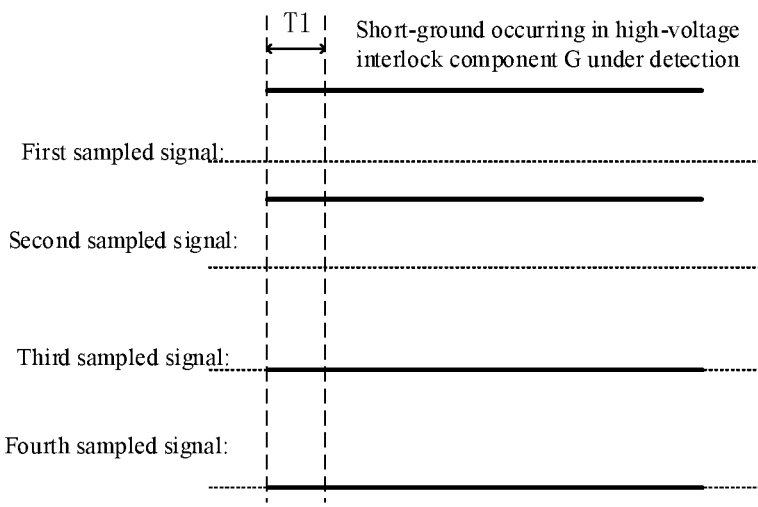
FIG. 7D is an exemplary waveform diagram of the first sampled signal, the second sampled signal, the third sampled signal and the fourth sampled signal corresponding to the high-voltage interlock component G under detection with a short-ground fault, provided by an embodiment of the present application.

(4) Assuming the short-ground fault occurs in the high-voltage interlock component G under detection, FIG. 7D is an exemplary waveform diagram of the first sampled signal, the second sampled signal, the third sampled signal and the fourth sampled signal corresponding to the high-voltage interlock component G under detection with the short-ground fault, provided by an embodiment of the present application. As shown in FIG. 7D, the fourth sampled signal is a low-level signal.

From the comparison of FIGS. 7A-7D, it can be seen that when the high-voltage interlock component G under detection is normal, the duty cycle of the fourth sampled signal is equal to 1−T1/T0, where T0 is a total time period, which is the same as the third sampled signal illustrated in conjunction with FIGS. 6A-6D. When the short power supply fault occurs in the high-voltage interlock component G under detection, the duty cycle of the third sampled signal is equal to 1. When the short-ground fault occurs in the high-voltage interlock component G under detection, the duty cycle of the third sampled signal is equal to 0.

The difference from the third sampled signal illustrated in conjunction with FIGS. 6A-6D is that after the first time period T1, the level of the third sampled signal is opposite to the level of the fourth sampled signal. Specifically, assuming the open-circuit fault occurs in the high-voltage interlock component G under detection, when the first time period T1 is sufficiently short, under a condition that the signal controlling the first switch module S1 and the second switch module S2 is a PWM signal and the second switch module S2 is turned on when the PWM signal applied to the second switch module S2 is at a high level, it can be approximately considered that the duty cycle of the fourth sampled signal is equal to the duty cycle of the PWM signal applied to the second switch module S2. Conversely, under a condition that the second switch module S2 is turned off when the PWM signal applied to the second switch module S2 is at a high level, it can be approximately considered that a sum of the duty cycle of the fourth sampled signal and the duty cycle of the PWM signal applied to the second switch module S1 is 1.

Accordingly, on the basis of the specific functions of the fault diagnosis module 13 described in the above embodiments in conjunction with FIGS. 5A-5D, the specific functions of the fault diagnosis module 13 shown in conjunction with FIGS. 7A-7D are similar to the specific functions of the fault diagnosis module 13 shown in conjunction with FIGS. 6A-6D, and will not be repeated here.

In another example, the fault diagnosis module 13 is specifically configured to: determine the fault of the high voltage interlock component G under detection according to at least one of the waveform diagram of the first sampled signal, the waveform diagram of the second sampled signal, the waveform diagram of the third sampled signal and the waveform diagram of the fourth sampled signal. Reference may be made to FIGS. 7A to 7D for details, which will not be repeated here.

Figure 8:
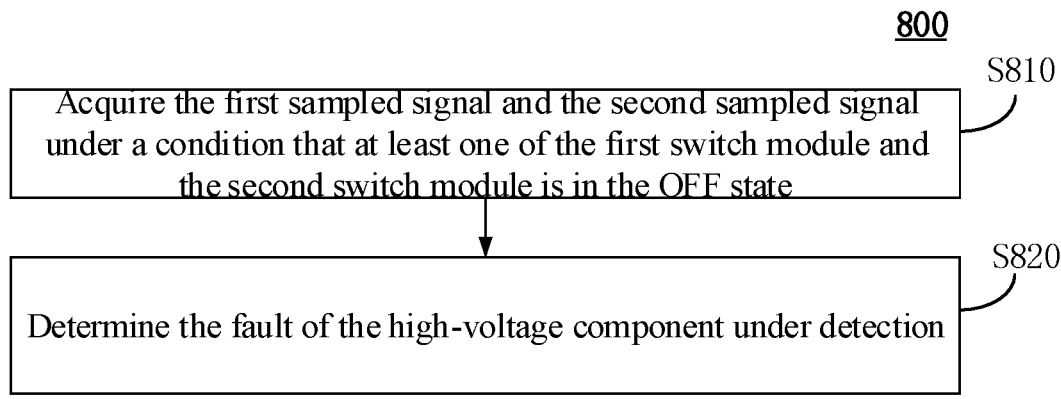
FIG. 8 is a schematic flowchart of a fault detection method for a high-voltage interlock device provided by an embodiment of the present application.

Based on the same inventive concept, on the basis of the high-voltage interlock device illustrated in conjunction with FIGS. 1 to 7D, a fault detection method for a high-voltage interlock device is provided in an embodiment of the present application. FIG. 8 is a schematic flowchart of a fault detection method for a high-voltage interlock device provided by an embodiment of the present application. As shown in FIG. 8, the fault detection method 800 includes S810 and S820.

At S810, under a condition that at least one of the first switch module S1 and the second switch module S2 is in the OFF state, the first sampled signal at an end of the first switch unit and the second sampled signal at an end of the second switch unit are acquired.

At S820, the fault of the high-voltage interlock component G under detection is determined according to the first sampled signal and the second sampled signal.

In some embodiments of the present application, S820 specifically includes: under a condition that both the first switch module S1 and the second switch module S2 are in the OFF state, determining that a short power supply fault occurs in the high-voltage interlock component G under detection when the first sampled signal and/or the second sampled signal are low-level signals; or, under a condition that the first switch module S1 is in an ON state and the second switch module S2 is in the OFF state, determining that the short power supply fault occurs in the high-voltage interlock component G under detection when the first sampled signal is a low-level signal, and determining that a short-ground fault or an open-circuit fault occurs in the high-voltage interlock component under detection when the second sampled signal is a high-level signal; or, under a condition that the first switch module is in the OFF state and the second switch module is in the ON state, determining that the short power supply fault occurs in the high-voltage interlock component under detection when the second sampled signal is a low-level signal, and determining that the short-ground fault or the open-circuit fault occurs in the high-voltage interlock component under detection when the first sampled signal is a high-level signal.

In some embodiments of the present application, when the fault diagnosis module 13 in the high-voltage interlock device is connected to the end of the high-voltage interlock component G under detection, S820 specifically includes: determining the fault of the high-voltage interlock component G under detection according to the first sampled signal, the second sampled signal, and a third sampled signal at the end of the high-voltage interlock component G under detection, under a condition that at least one of the first switch module S1 and the second switch module S2 is in the OFF state.

In some embodiments, S820 specifically includes: under a condition that both the first switch module S1 and the second switch module S2 are in the OFF state, determining that a short power supply fault occurs in the high-voltage interlock component under detection when the first sampled signal is a low-level signal, the second sampled signal is a low-level signal, or the third sampled signal is a high-level signal; or, under a condition that the first switch module S1 is in an ON state and the second switch module S2 is in the OFF state, determining that the short power supply fault occurs in the high-voltage interlock component G under detection when the first sampled signal is a low-level signal, determining that a short-ground fault occurs in the high-voltage interlock component under detection when the third sampled signal is a low-level signal, and determining that an open-circuit fault occurs in the high-voltage interlock component under detection when both the second sampled signal and the third sampled signal are high-level signals; or, under a condition that the first switch module S1 is in the OFF state and the second switch module S2 is in the ON state, determine that the short power supply fault occurs in the high-voltage interlock component G under detection when the second sampled signal is a low-level signal, and determine that the short-ground fault or the open-circuit fault occurs in the high-voltage interlock component under detection when the first sampled signal is a high-level signal and/or the third sampled signal is a low-level signal.

In some embodiments of the present application, when the fault diagnosis module 13 in the high-voltage interlock device is connected to the another end of the high-voltage interlock component G under detection, S820 specifically includes: determining the fault of the high-voltage interlock component G under detection according to the first sampled signal, the second sampled signal, the third sampled signal and a fourth sampled signal at the another end of the high-voltage interlock component G under detection, under a condition that at least one of the first switch module S1 and the second switch module S2 is in the OFF state.

In some embodiments, S820 specifically includes: under a condition that both the first switch module S1 and the second switch module S2 are in the OFF state, determining that a short power supply fault occurs in the high-voltage interlock component G under detection when the first sampled signal is a low-level signal, the second sampled signal is a low-level signal, the third sampled signal is a high-level signal, or the fourth sampled signal is a high-level signal; or, under a condition that the first switch module S1 is in an ON state and the second switch module S2 is in the OFF state, determining that the short power supply fault occurs in the high-voltage interlock component G under detection when the first sampled signal is a low-level signal, determining that a short-ground fault occurs in the high-voltage interlock component under detection when the third sampled signal is a low-level signal, and determining that an open-circuit fault occurs in the high-voltage interlock component under detection when both the second sampled signal and the third sampled signal are high-level signals or when the third sampled signal is a high-level signal and the fourth sampled signal is a low-level signal; or, under a condition that the first switch module S1 is in the OFF state and the second switch module S2 is in the ON state, determine that the short power supply fault occurs in the high-voltage interlock component G under detection when the second sampled signal is a low-level signal, determine that the short-ground fault occurs in the high-voltage interlock component under detection when the fourth sampled signal is a low-level signal, and determine that the open-circuit fault occurs in the high-voltage interlock component under detection when both the first sampled signal and the fourth sampled signal are high-level signals or when the third sampled signal is a low-level signal and the fourth sampled signal is a high-level signal.

In some embodiments of the present application, the fault detection method for the high-voltage interlock device further includes: controlling, by a control module, ON and OFF of the first switch module S1 and the second switch module S2 according to a preset control strategy.

In some embodiments, the preset control strategy includes: controlling, in a first time period, the first switch module S1 and the second switch module S2 to be in the OFF state; controlling, after the first time period, the first switch module S1 and the second switch module S2 to be in the OFF state periodically and alternately.

In some embodiments, based on the above preset control strategy, S820 specifically includes: determining the fault of the high-voltage interlock component G under detection according to a duty cycle of the first sampled signal and/or a duty cycle of the second sampled signal.

In some embodiments, based on the above preset control strategy, S820 specifically includes: determining that a short power supply fault occurs in the high-voltage interlock component under detection when the duty cycle of the first sampled signal is 0 and/or the duty cycle of the second sampled signal is 0; determining that an open-circuit fault or a short-ground fault occurs in the high-voltage interlock component under detection when the duty cycle of the first sampled signal is 1 and/or the duty cycle of the second sampled signal is 1.

Other details of the fault detection method for the high-voltage interlock device according to the embodiments of the present application are similar to the high-voltage interlock device according to the embodiments of the present application described above in conjunction with FIG. 1 to FIG. 7D, and will not be repeated here.

It should be specified that various embodiments in the specification are described in a progressive manner, and the same or similar parts between the various embodiments can be referred to by each other. Each embodiment focuses on differences from other embodiments. Place. The description of the method embodiments is relatively simple, and please refer to the parts describing the system embodiments for related details. The application is not limited to the specific steps and structures described above and shown in the figures. Those skilled in the art can make various changes, modifications and additions, or change the order of steps, after grasping the spirit of the application. For the sake of brevity, a detailed description of known methods and technologies is omitted here.

The functional blocks in the above embodiments may be implemented as hardware, software, firmware, or a combination thereof. When implemented in hardware, the functional blocks may be, for example, electronic circuits, application specific integrated circuits (ASICs), appropriate firmware, plug-ins, function cards, and so on. When implemented in software, elements of the present application may be programs or code segments used to perform required tasks. The programs or code segments may be stored in a machine-readable medium, or may be transmitted on a transmission medium or a communication link via a data signal carried in a carrier wave. "Machine-readable medium" may include any medium that can store or transmit information.

Although the present application has been described with reference to preferred embodiments, various modifications may be made thereto and components thereof may be replaced with equivalents, without departing from the scope of the present application. In particular, as long as there is no structural conflict, various technical features mentioned in various embodiments can be combined in any manner. This application is not limited to the specific embodiments disclosed herein, instead, it can include all technical solutions that fall within the scope of the claims.

What is claimed is:

1. A high-voltage interlock device, comprising:
   a first signal detection circuit, a first connection terminal of the first signal detection circuit being connected to an end of a high-voltage interlock component under detection, a second connection terminal of the first signal detection circuit being connected to an end of a first switch module, an output terminal of the first signal detection circuit being connected to a fault diagnosis module, and the first signal detection circuit being configured to collect a first original electric signal from the high-voltage interlock component under detection and convert the first original electric signal into a first sampled signal while ensuring that the high-voltage interlock component under detection is isolated from the fault diagnosis module;
   a second signal detection circuit, a first connection terminal of the second signal detection circuit being connected to another end of the high-voltage interlock component under detection, a second connection terminal of the second signal detection circuit being connected to an end of a second switch module, an output terminal of the second signal detection circuit being connected to the fault diagnosis module, and the second signal detection circuit being configured to collect a second original electric signal from the high-voltage interlock component under detection and convert the second original electric signal into a second sampled signal while ensuring that the high-voltage interlock component under detection is isolated from the fault diagnosis module;
   the first switch module, another end of the first switch module being connected to a first power terminal;
   the second switch module, another end of the second switch module being connected to a second power terminal;
   the fault diagnosis module, configured to determine a fault of the high-voltage interlock component under detection according to the first sampled signal and/or the second sampled signal, under a condition that at least one of the first switch module and the second switch module is in an OFF state,
   wherein the fault diagnosis module is configured to:
   under a condition that both the first switch module and the second switch module are in the OFF state, determine that a short power supply fault occurs in the high-voltage interlock component under detection when the first sampled signal and/or the second sampled signal are low-level signals.

2. The high-voltage interlock device according to claim 1, wherein
   the first signal detection circuit comprises a third switch module, a first resistance module, a second resistance module, and a third resistance module, wherein
   the third switch module comprises a first drive unit and a first switch unit arranged in isolation,
   an end of the first drive unit is used as the first connection terminal of the first signal detection circuit, the end of the first drive unit is further connected to an end of the second resistance module; another end of the first drive unit is used as the second connection terminal of the first signal detection circuit, and the another end of the first drive unit is further connected to an end of the first resistance module and another end of the second resistance module, respectively,
   an end of the first switch unit is used as the output terminal of the first signal detection circuit, and the end of the first switch unit is further connected to a third power terminal through the third resistance module; another end of the first switch unit is connected to a first reference potential,
   the end of the first resistance module is further connected to the another end of the second resistance module, and another end of the first resistance module is connected to a second reference potential;
   the second signal detection circuit comprises a fourth switch module, a fourth resistance module, a fifth resistance module, and a sixth resistance module, wherein
   the fourth switch module comprises a second drive unit and a second switch unit arranged in isolation,
   an end of the second drive unit is used as the first connection terminal of the second signal detection circuit, the end of the second drive unit is further connected to an end of the fifth resistance module; another end of the second drive unit is used as the second connection terminal of the second signal detection circuit, and the another end of the second drive unit is further connected to an end of the fourth resistance module and another end of the fifth resistance module, respectively,
   an end of the second switch unit is used as the output terminal of the second signal detection circuit, and the end of the second switch unit is further connected to a fourth power terminal through the sixth resistance module; another end of the second switch unit is connected to a third reference potential,
   the end of the fourth resistance module is further connected to the another end of the fifth resistance module, and another end of the fourth resistance module is connected to a fourth reference potential.

3. The high-voltage interlock device according to claim 1, wherein the fault diagnosis module is configured to:
   under a condition that the first switch module is in an ON state and the second switch module is in the OFF state, determine that the short power supply fault occurs in the high-voltage interlock component under detection when the first sampled signal is a low-level signal, and determine that a short-ground fault or an open-circuit fault occurs in the high-voltage interlock component under detection when the second sampled signal is a high-level signal.

4. The high-voltage interlock device according to claim 1, wherein the fault diagnosis module is configured to:
under a condition that the first switch module is in the OFF state and the second switch module is in the ON state, determine that the short power supply fault occurs in the high-voltage interlock component under detection when the second sampled signal is a low-level signal, and determine that the short-ground fault or the open-circuit fault occurs in the high-voltage interlock component under detection when the first sampled signal is a high-level signal.

5. The high-voltage interlock device according to claim 1, wherein
the fault diagnosis module is connected to the end of the high-voltage interlock component under detection,
the fault diagnosis module is further configured to:
determine the fault of the high-voltage interlock component under detection according to the first sampled signal, the second sampled signal, and a third sampled signal at the end of the high-voltage interlock component under detection, under a condition that at least one of the first switch module and the second switch module is in the OFF state.

6. The high-voltage interlock device according to claim 5, wherein the fault diagnosis module is configured to:
under a condition that both the first switch module and the second switch module are in the OFF state, determine that a short power supply fault occurs in the high-voltage interlock component under detection when the first sampled signal is a low-level signal, the second sampled signal is a low-level signal, or the third sampled signal is a high-level signal.

7. The high-voltage interlock device according to claim 5, wherein the fault diagnosis module is configured to:
under a condition that the first switch module is in an ON state and the second switch module is in the OFF state, determine that the short power supply fault occurs in the high-voltage interlock component under detection when the first sampled signal is a low-level signal, determine that a short-ground fault occurs in the high-voltage interlock component under detection when the third sampled signal is a low-level signal, and determine that an open-circuit fault occurs in the high-voltage interlock component under detection when both the second sampled signal and the third sampled signal are high-level signals.

8. The high-voltage interlock device according to claim 5, wherein the fault diagnosis module is configured to:
under a condition that the first switch module is in the OFF state and the second switch module is in the ON state, determine that the short power supply fault occurs in the high-voltage interlock component under detection when the second sampled signal is a low-level signal, and determine that the short-ground fault or the open-circuit fault occurs in the high-voltage interlock component under detection when the first sampled signal is a high-level signal and/or the third sampled signal is a low-level signal.

9. The high-voltage interlock device according to claim 5, wherein:
the fault diagnosis module is connected to the another end of the high-voltage interlock component under detection,
the fault diagnosis module is further configured to:
determine the fault of the high-voltage interlock component under detection according to the first sampled signal, the second sampled signal, the third sampled signal and a fourth sampled signal at the another end of the high-voltage interlock component under detection, under a condition that at least one of the first switch module and the second switch module is in the OFF state.

10. The high-voltage interlock device according to claim 9, wherein the fault diagnosis module is configured to:
under a condition that both the first switch module and the second switch module are in the OFF state, determine that a short power supply fault occurs in the high-voltage interlock component under detection when the first sampled signal is a low-level signal, the second sampled signal is a low-level signal, the third sampled signal is a high-level signal, or the fourth sampled signal is a high-level signal.

11. The high-voltage interlock device according to claim 9, wherein the fault diagnosis module is configured to:
under a condition that the first switch module is in an ON state and the second switch module is in the OFF state, determine that the short power supply fault occurs in the high-voltage interlock component under detection when the first sampled signal is a low-level signal, determine that a short-ground fault occurs in the high-voltage interlock component under detection when the third sampled signal is a low-level signal, and determine that an open-circuit fault occurs in the high-voltage interlock component under detection when both the second sampled signal and the third sampled signal are high-level signals or when the third sampled signal is a high-level signal and the fourth sampled signal is a low-level signal.

12. The high-voltage interlock device according to claim 9, wherein the fault diagnosis module is configured to:
under a condition that the first switch module is in the OFF state and the second switch module is in the ON state, determine that the short power supply fault occurs in the high-voltage interlock component under detection when the second sampled signal is a low-level signal, determine that the short-ground fault occurs in the high-voltage interlock component under detection when the fourth sampled signal is a low-level signal, and determine that the open-circuit fault occurs in the high-voltage interlock component under detection when both the first sampled signal and the fourth sampled signal are high-level signals or when the third sampled signal is a low-level signal and the fourth sampled signal is a high-level signal.

13. The high-voltage interlock device according to claim 1, further comprising:
a control module configured to control ON and OFF of the first switch module and the second switch module according to a preset control strategy.

14. The high-voltage interlock device according to claim 13, wherein the preset control strategy comprises:
controlling, in a first time period, the first switch module and the second switch module to be in the OFF state;
controlling, after the first time period, the first switch module and the second switch module to be in the OFF state periodically and alternately.

15. The high-voltage interlock device according to claim 14, wherein the fault diagnosis module is configured to:
determine the fault of the high-voltage interlock component under detection according to a duty cycle of the first sampled signal and/or a duty cycle of the second sampled signal.

16. The high-voltage interlock device according to claim 14, wherein the fault diagnosis module is further configured to:
determine that a short power supply fault occurs in the high-voltage interlock component under detection when the duty cycle of the first sampled signal is 0 and/or the duty cycle of the second sampled signal is 0;
determine that an open-circuit fault or a short-ground fault occurs in the high-voltage interlock component under detection when the duty cycle of the first sampled signal is 1 and/or the duty cycle of the second sampled signal is 1.

17. The high-voltage interlock device according to claim 2, further comprising:
a seventh resistance module provided between the first power terminal and the first switch module; and/or
an eighth resistance module provided between the second power terminal and the second switch module.

18. The high-voltage interlock device according to claim 1, further comprising:
a first anti-reverse module, an input terminal of the first anti-reverse module being connected to the first power terminal, and an output terminal of the first anti-reverse module being connected to the end of the first switch module; and/or
a second anti-reverse module, an input terminal of the second anti-reverse module being connected to the second power terminal, and an output terminal of the second anti-reverse module being connected to the end of the second switch module.

19. The high-voltage interlock device according to claim 2, wherein
the first drive unit and the second drive unit comprise light-emitting elements;
the first switch unit and the second switch unit comprise optical switches.

* * * * *